United States Patent
Kato et al.

(10) Patent No.: US 9,972,913 B2
(45) Date of Patent: May 15, 2018

(54) NOISE ABSORBING FABRIC

(75) Inventors: Kazufumi Kato, Tokyo (JP); Tomoya Tanaka, Tokyo (JP); Rumina Obi, Tokyo (JP)

(73) Assignee: ASAHI KASEI FIBERS CORPORATION, Osaka (JP)

( * ) Notice: Subject to any disclaimer, the term of this patent is extended or adjusted under 35 U.S.C. 154(b) by 0 days. days.

(21) Appl. No.: 13/515,449

(22) PCT Filed: Dec. 15, 2010

(86) PCT No.: PCT/JP2010/072570
§ 371 (c)(1),
(2), (4) Date: Jun. 12, 2012

(87) PCT Pub. No.: WO2011/074609
PCT Pub. Date: Jun. 23, 2011

(65) Prior Publication Data
US 2012/0247868 A1 Oct. 4, 2012

(30) Foreign Application Priority Data
Dec. 15, 2009 (JP) ................................. 2009-284054

(51) Int. Cl.
 *B32B 15/14* (2006.01)
 *H01Q 17/00* (2006.01)
 *H05K 9/00* (2006.01)

(52) U.S. Cl.
 CPC ......... *H01Q 17/005* (2013.01); *H05K 9/0084* (2013.01)

(58) Field of Classification Search
CPC . E04B 1/82; E04B 1/84; E04B 1/8209; E04B 1/8409; E04B 1/88; Y10T 428/2915; H05K 9/0084
(Continued)

(56) References Cited

U.S. PATENT DOCUMENTS 4,865,892 A * 9/1989 Winfield .............. H02G 15/188
  156/86
5,122,412 A * 6/1992 Jones et al. ................... 442/376
(Continued)

FOREIGN PATENT DOCUMENTS

DE  31 17 245     11/1932
EP  1 978 798 A1 10/2008
(Continued)

OTHER PUBLICATIONS

English-language International Search Report from the Japanese Patent Office dated Mar. 29, 2011, for International Application No. PCT/JP2010/072570.
(Continued)

*Primary Examiner* — Peter Y Choi
(74) *Attorney, Agent, or Firm* — Finnegan, Henderson, Farabow, Garrett & Dunner, LLP

(57) ABSTRACT

An object of the present invention is to provide a noise absorbing fabric in which electromagnetic waves are not susceptible to being reflected and which has superior noise absorbing ability, a noise absorbing fabric having noise absorbing ability across a wide band, a noise absorbing fabric that is soft, highly flexible, thin, and can be incorporated in intricate portions of electronic components or housings and the like by being bent or folded and the like, and a noise absorbing fabric that can be easily and stably produced without using an expensive soft magnetic material, is inexpensive and demonstrates high performance. In the noise absorbing fabric, a metal is subjected to metal processing on at least one side of a fabric, and the common logarithmic value of the surface resistivity of the surface subjected to metal processing is within the range of 0 to 4.

11 Claims, 11 Drawing Sheets

(58) Field of Classification Search
USPC .................................................. 442/376, 379
See application file for complete search history.

(56) References Cited

U.S. PATENT DOCUMENTS

| | | | |
|---|---|---|---|
| 5,344,696 A * | 9/1994 | Hastings et al. | 428/220 |
| 5,827,445 A | 10/1998 | Yoshida | |
| 2005/0039937 A1 | 2/2005 | Yeh et al. | |
| 2006/0083948 A1 | 4/2006 | Kawaguchi | |
| 2006/0292954 A1 | 12/2006 | Suzuka | |
| 2008/0049410 A1 * | 2/2008 | Kawaguchi et al. | 361/818 |
| 2008/0296087 A1 * | 12/2008 | Tanaka et al. | 181/290 |
| 2009/0173569 A1 * | 7/2009 | Levit | E04B 1/8409 |
| | | | 181/286 |
| 2009/0173570 A1 * | 7/2009 | Levit et al. | 181/286 |
| 2009/0314411 A1 | 12/2009 | Kawaguchi et al. | |
| 2009/0314539 A1 | 12/2009 | Kawaguichi et al. | |
| 2012/0045626 A1 | 2/2012 | Inokuma | |

FOREIGN PATENT DOCUMENTS

| | | |
|---|---|---|
| EP | 2 014 841 A1 | 1/2009 |
| JP | 61-245372 | 10/1986 |
| JP | 61-245372 A | 10/1986 |
| JP | 02-0820896 A | 3/1990 |
| JP | 3-246999 | 5/1991 |
| JP | 3-237799 | 10/1991 |
| JP | 3-250797 | 11/1991 |
| JP | 6-264093 | 10/1994 |
| JP | 9-93034 | 4/1997 |
| JP | 11-001874 | 6/1999 |
| JP | 11-247074 | 9/1999 |
| JP | 2000-208984 A | 7/2000 |
| JP | 2001-180395 | 7/2001 |
| JP | 2003-289196 A | 10/2003 |
| JP | 2005-101474 | 4/2005 |
| JP | 2005-251918 | 9/2005 |
| JP | 2006-60008 | 3/2006 |
| JP | 2006-93414 | 4/2006 |
| JP | 2006-295101 | 10/2006 |
| JP | 2008-053375 | 3/2008 |
| JP | 2008-118116 | 5/2008 |
| JP | 2008-186997 | 8/2008 |
| JP | 2008-270582 | 11/2008 |
| JP | 2009-267230 | 11/2009 |
| JP | 2009-283688 | 12/2009 |
| TW | 593833 | 8/1992 |
| WO | WO 2004/094136 A1 | 4/2004 |
| WO | WO 2010/126109 A1 | 4/2010 |

OTHER PUBLICATIONS

Official Action in a corresponding Taiwanese Application No. (02)23767313 dated Jul. 29, 2013 (9 pages).
Supplementary European Search Report for corresponding EP Application No. EP 10 83 7635. dated Oct. 29. 2013.
Korean Patent Office, "Notice of Reasons for Rejection," Office Action, dated Apr. 28, 2014, 5 pages.
Japan Patent Office, "Notice of Reasons for Rejection," Office Action, dated May 20, 2014, 3 pages.
Office Action for JP Patent Application No. 2014-146571 dated Mar. 24, 2015.

* cited by examiner

NOISE ABSORBING FABRIC

The present invention is a national stage application of PCT Application No. PCT/JP2010/072570, which has an International Filing Date of Dec. 15, 2010, and claims priority to Japanese Patent Application No. 2009-284054, filed on Dec. 15, 2009.

The present invention relates to a noise absorbing fabric in which a metal is subjected to metal processing on at least one side of a fabric.

TECHNICAL FIELD

The amount of information being handled has increased remarkably due to the full-scale proliferation of electronic equipment such as personal computers and large-screen televisions as well as wireless communication devices such as cellular telephones and wireless LAN. Consequently, these electronic equipment and wireless communication devices are being increasingly required to demonstrate even higher capacities, higher levels of integration, faster communication rates as well as faster and more efficient processing of increasingly large amounts of information. In order to satisfy these requirements, the clock frequencies of LSI and the transmission frequencies used in electronic equipment are shifting to higher frequencies while the frequencies utilized by communications equipment are also becoming higher.

As a result of these higher frequencies, there has been reported to be increased susceptibility to malfunctions in other devices caused by noise generated from electronic equipment as well as increased likelihood of problems with electronic equipment and communications due to interference between the radio waves used in communications devices.

Consequently, there is a growing need for the use of noise absorbing materials that absorb noise generated from electronic equipment in the form of so-called EMC countermeasures for the purpose preventing electromagnetic wave interference in electronic components, transmission lines and communication systems.

Moreover, society is becoming increasingly ubiquitous, the number of mobile personal computers is growing, and cell phones are becoming increasingly compact and advanced. Thus, there is a demand for devices and materials that make it possible to realize smaller size and lighter weight.

Patent Documents 1 and 2 disclose noise absorbing sheets in which a soft magnetic material is dispersed in a resin and the practical use thereof. The principle by which these noise absorbing sheets demonstrate performance involves the soft magnetic material dispersed in the resin capturing electromagnetic waves, magnetically polarizing the captured electromagnetic waves, and then converting the electromagnetic waves to thermal energy due to the loss of magnetic properties at that time. Although it is necessary to mix and disperse the soft magnetic material in a resin since it is a powder, since the soft magnetic powder has a high degree of hardness, it is difficult to uniformly disperse the powder in the resin at high concentrations. In addition, since it is difficult to wind the produced sheet into a roll, it is not suitable for continuous production of electronic devices and the like.

Moreover, since the aforementioned noise absorbing sheets are obtained by dispersing a soft magnetic powder having high specific gravity, the sheets are thick, making it difficult to be incorporated in confined locations. In addition, although a rubbery substance is selected for the matrix resin of these noise absorbing sheets in consideration of ease of use, it was difficult to incorporate the sheets at locations having a high degree of curvature as well as use the sheets in a folded form.

Moreover, powders having a complex composition and structure for the soft magnetic material for the purpose of accommodating higher frequencies are known to be used in noise absorbing sheets. For example, although attempts were made to control magnetic properties by forming more complex compounds using rare metals and/or trace elements for the raw materials of the soft magnetic material, there can be problems in terms of costs. Although attempts were also made to enhance polarization of the soft magnetic material by using soft magnetic materials in the shape of needles or scales, in addition to it being extremely difficult to increase the concentration of the soft magnetic material and realize a uniform sheet, there were also problems with costs and handling ease.

In addition, magnetic materials, including the aforementioned soft magnetic materials, only demonstrate effects against certain specific frequencies, and it is known to be difficult to use these materials to absorb noise over a wide band.

Consequently, studies were conducted to develop a sheet by mixing particles effective for various frequencies. However, when such particles are mixed, the effect of each of the particles diminishes, thereby making it difficult to absorb noise over a wide frequency band while also resulting in problems such as difficulty in forming the particles into a sheet.

Patent Documents 3 and 4 disclose noise absorbing sheets in which a soft magnetic material or metal is processed on the surface of a resin sheet. However, since these noise absorbing sheets consist of depositing a soft magnetic material or metal on a resin sheet or film-like material, the surface of the sheet is smooth and it was difficult to realize high performance. Thus, although isolating functions, using multiple layers and lamination were attempted to realize higher performance, not only was it difficult to enhance performance, but the sheets became increasingly thick and difficult to use.

Patent Documents 5 and 6 disclose a sheet-like composite magnetic material and a noise absorbing material, respectively. However, since the articles described in Patent Documents 5 and 6 both have smooth surfaces, electromagnetic waves are strongly reflected due to the electrical conductivity of the metal itself, thereby impairing absorption of electromagnetic waves.

As indicated in Patent Documents 3 to 6, when a layer of a magnetic material or metal material is formed on a smooth surface such as that of a film or sheet, the layer of the magnetic material or metal material becomes smooth, the electrical conductivity inherently possessed by the magnetic material or metal material is actualized, and electromagnetic waves are reflected due to this high level of electrical conductivity. Instead of absorbing noise, these materials conversely ended up amplifying noise due to resonance of electromagnetic waves.

Patent Document 7 discloses a noise absorbing sheet obtained by laminating a layer containing electrically conductive fibers and a layer containing a magnetic material. However, in the noise absorbing sheet of Patent Document 7, noise absorbing ability was primarily attributable to the magnetic material, and it was unclear as to whether or not electrically conductive fibers have the ability to absorb noise. Moreover, in regions of the sheet where the proportion of electrically conductive fibers is high and electrical conductivity is excessively large, reflection of electromagnetic waves becomes strong resulting in the problem of impairment of absorption performance.

In addition, Patent Document 8 provided an alternative to the soft magnetic material disclosed in Patent Document 1 or 2 by dispersing electrically conductive fibers in a resin. However, the electrically conductive fibers used in Patent Document 8 were composed of an ordinary material and did not have the ability to absorb noise. Namely, since electrically conductive fibers are merely dispersed in a resin as an alternative to a needle-shaped soft magnetic material, the noise absorbing ability thereof did not reach the level of finished resin dispersed sheet products of a soft magnetic material like that disclosed in Patent Document 1. In addition, the operating principle behind this sheet was not explained, and it was not practical for use as a noise absorbing sheet since it did not demonstrate any noise absorbing ability and resulted in excessively strong reflection of electromagnetic waves.

PRIOR ART DOCUMENTS

Patent Documents

Patent Document 1: Japanese Unexamined Patent Publication No. H9-93034
Patent Document 2: Japanese Unexamined Patent Publication No. 2005-251918
Patent Document 3: Japanese Unexamined Patent Publication No. 2005-101474
Patent Document 4: Japanese Unexamined Patent Publication No. 2006-93414
Patent Document 5: Japanese Unexamined Patent Publication No. 2006-60008
Patent Document 6: Japanese Unexamined Patent Publication No. 2006-295101
Patent Document 7: Japanese Unexamined Patent Publication No. 2008-186997
Patent Document 8: Japanese Unexamined Patent Publication No. 2008-118116

SUMMARY OF THE INVENTION

Problems to be Solved by the Invention

As has been described above, noise absorbing articles of the prior art had problems with respect ease of use, noise absorbing ability and the like.

Thus, an object of the present invention is to provide a noise absorbing fabric in which electromagnetic waves are not susceptible to being reflected and which has superior noise absorbing ability.

In addition, an object of the present invention is to provide a noise absorbing fabric having noise absorbing ability across a wide band.

Moreover, an object of the present invention is to provide a noise absorbing fabric that is soft, highly flexible, thin, and can be incorporated in intricate portions of electronic components or housings and the like by being bent or folded and the like.

Moreover, an object of the present invention is to provide a noise absorbing fabric that can be easily and stably produced without using an expensive soft magnetic material, is inexpensive, and demonstrates high performance.

Means for Solving the Problems

As a result of repeatedly conducting extensive studies to solve the aforementioned problems, the inventors of the present invention found that the aforementioned problems can be solved with a noise absorbing fabric in which a metal is subjected to metal processing on at least one side of a fabric, wherein the common logarithmic value of the surface resistivity of the surface subjected to metal processing is within the range of 0 to 4, thereby leading to completion of the present invention.

More specifically, the present relates to the aspects indicated below.

[Aspect 1]

A noise absorbing fabric in which a metal is subjected to metal processing on at least one side of a fabric, wherein the common logarithmic value of the surface resistivity of the surface subjected to metal processing is within the range of 0 to 4.

[Aspect 2]

The noise absorbing fabric described in Aspect 1, wherein electrical conductivity inside the fabric is smaller than electrical conductivity on the surface on which the metal is subjected to metal processing.

[Aspect 3]

The noise absorbing fabric described in Aspect 1 or Aspect 2, wherein the fabric is a non-woven fabric composed of synthetic long fibers.

[Aspect 4]

The noise absorbing fabric described in any of Aspects 1 to 3, wherein the fabric contains a layer of fibers having a fiber diameter of 7 μm or less.

[Aspect 5]

The noise absorbing fabric described in any of Aspects 1 to 4, wherein the metal is subjected to metal processing by metal deposition.

[Aspect 6]

The noise absorbing fabric described in any of Aspects 1 to 5, wherein the thickness of the metal is 2 nm to 400 nm.

[Aspect 7]

The noise absorbing fabric described in any of Aspects 1 to 6, wherein the thickness of the fabric is 10 μm to 400 μm and the basis weight is 7 g/m² to 300 g/m².

[Aspect 8]

The noise absorbing fabric described in any of Aspects 1 to 7, wherein the fabric is subjected to calendering.

[Aspect 9]

The noise absorbing fabric described in any of Aspects 1 to 8, wherein the mean pore size of the fabric is 0.5 μm to 5.0 mm.

[Aspect 10]

The noise absorbing fabric described in any of Aspects 1 to 9, wherein the metal is one or a plurality of metals not having magnetic properties.

[Aspect 11]

The noise absorbing fabric described in any of Aspects 1 to 9, wherein the metal is subjected to metal processing by depositing one or a plurality of metals having a valve action.

[Aspect 12]

A noise absorbing article containing the noise absorbing fabric described in any of Aspects 1 to 11.

Effects of the Invention

The noise absorbing fabric of the present invention is not susceptible to reflection of electromagnetic waves and has superior noise absorbing ability.

In addition, the noise absorbing fabric of the present invention has noise absorbing ability across a wide band.

Moreover, the noise absorbing fabric of the present invention is soft, highly flexible, thin, and can be incorporated in intricate portions of electronic components or housings and the like by being bent or folded and the like.

Moreover, the noise absorbing fabric of the present invention can be easily and stably produced without using an expensive soft magnetic material, is inexpensive and demonstrates high performance.

EMBODIMENTS OF THE INVENTION

The following provides a detailed explanation of the noise absorbing fabric of the present invention.

The noise absorbing fabric of the present invention has a metal subjected to metal processing on at least one side of a fabric.

Figure 1:
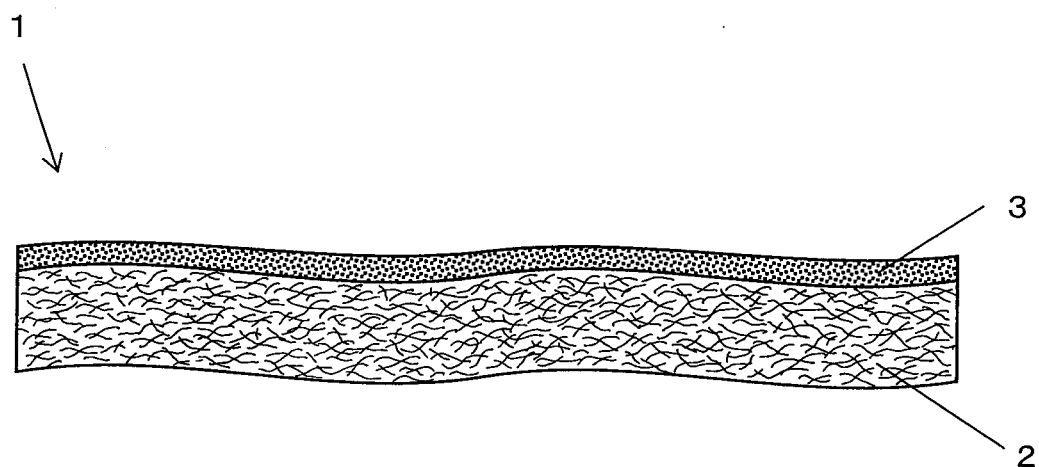
FIG. 1 is a drawing schematically showing a cross-section of the noise absorbing fabric of the present invention.

FIG. 1 is a drawing schematically showing a cross-section of the noise absorbing fabric of the present invention. A noise absorbing fabric 1 in FIG. 1 contains a fabric 2 and a metal-processed metal 3.

Figure 2:
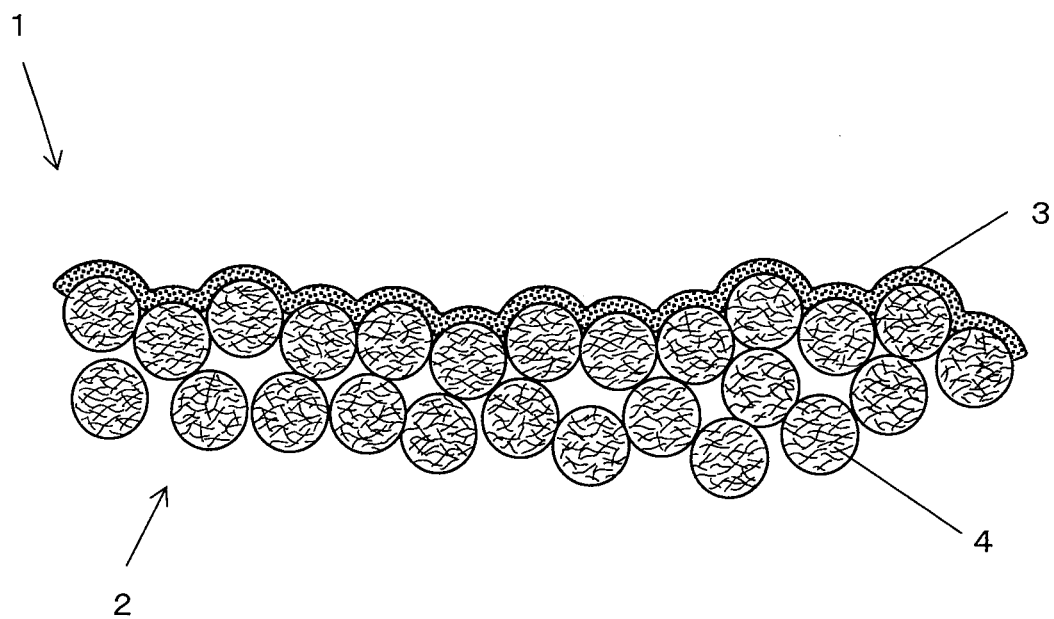
FIG. 2 is an enlarged schematic diagram of a cross-section of one aspect of the noise absorbing fabric of the present invention.

FIG. 2 is an enlarged schematic diagram of a cross-section of one aspect of the noise absorbing fabric of the present invention. The noise absorbing fabric 1 of FIG. 2 contains the fabric 2 and the metal-processed metal 3, and the metal-processed metal 3 is formed on fibers 4 composing the fabric 2.

Furthermore, in FIG. 2, all of the fiber cross-sections are represented as being circular for the sake of convenience.

The common logarithmic value of the surface resistivity ($\Omega/\square$) of the surface subjected to metal processing of the noise absorbing fabric of the present invention is within the range of 0 to 4. The common logarithmic value of surface resistivity refers to the value of $\log_{10} X$ in the case of defining surface resistivity as X ($\Omega/\square$). If the common logarithmic value of surface resistivity is less than 0, electrical conductivity becomes excessively large and the majority of electromagnetic waves are reflected by the surface of the noise absorbing fabric, and more accurately, by the surface subjected to metal processing, resulting in inferior noise absorbing ability. In the case electrical conductivity is excessively small, interference occurs between electromagnetic waves, thereby impairing noise absorption.

On the other hand, if the aforementioned common logarithmic value of surface resistivity exceeds 4, electromagnetic waves ends up permeating the noise absorbing fabric and this may result in inferior electromagnetic wave absorbing ability (capturing ability). In the case the common logarithmic value of surface resistivity is within the range of 0 to 4, since electromagnetic waves suitably penetrate inside the noise absorbing fabric of the present invention, and the penetrating electromagnetic waves are captured by the metal-processed metal, converted to electricity, and further converted to thermal energy by electrical resistance, noise absorbing ability improves. The common logarithmic value of the surface resistivity of the noise absorbing fabric is preferably within the range of 0.1 to 3.

The aforementioned surface resistivity can be measured with the four-terminal method using the Loresta GP Model MCP-T600 Low Resistance Meter manufactured by Mitsubishi Chemical Corp.

Figure 3:
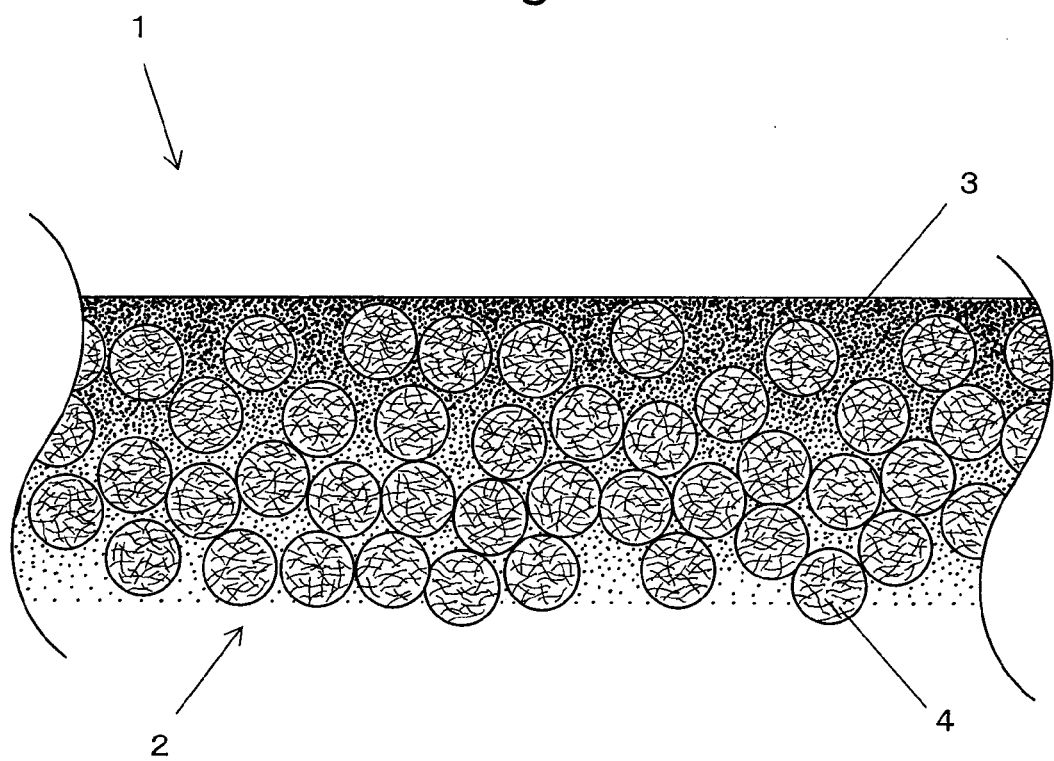
FIG. 3 is a drawing for explaining an electrical conductivity gradient of the noise absorbing fabric of the present invention.

The inside of the noise absorbing fabric preferably has lower electrical conductivity than the surface on which the metal is subjected to metal processing. An example of means for making internal electrical conductivity lower than that of the metal-processed surface consists of lowering the ratio of metal to the total amount of metal and fabric inside the noise absorbing fabric of the present invention below that of the surface on which the metal is subjected to metal processing. FIG. 3 is a drawing for explaining an electrical conductivity gradient of the noise absorbing fabric of the present invention. The noise absorbing fabric of FIG. 3 contains the fabric 2 formed from the fibers 4 and the metal-processed metal 3. In FIG. 3, the ratio of metal to the total amount of metal and fabric inside the fabric (downward direction in the drawing) is lower than the ratio of metal to the total amount of metal and fabric on the surface (upward direction in the drawing). Thus, the noise absorbing fabric 1 of FIG. 3 has lower electrical conductivity inside the fabric than on the surface thereof.

Furthermore, in FIG. 3, all of the fiber cross-sections are represented as being circular for the sake of convenience. In addition, in the present description, "electrical conductivity" refers to the degree of electrical conductivity.

As a result of having a suitable electrical conductivity gradient, although electromagnetic waves that have penetrated from the outside are captured in a portion having large electrical conductivity and are converted to electrical current, since electrical conductivity becomes smaller moving towards the inside of the fabric in particular, namely since electrical resistance becomes larger, the electric current is readily converted to thermal energy due to electrical resistance. As a result, electromagnetic waves are efficiently absorbed and noise can be absorbed.

The aforementioned electrical conductivity gradient can be achieved by, for example, a metal deposition method to be subsequently described.

Although the aforementioned noise absorbing fabric has a metal subjected to metal processing on at least one side of the fabric, metal may also be subjected to metal processing on both sides of the fabric.

In a noise absorbing fabric in which metal is subjected to metal processing on both sides of the fabric, electrical conductivity inside the fabric is preferably smaller than electrical conductivity on the surface on which metal is subjected to metal processing on at least one side thereof, and electrical conductivity inside the fabric is more preferably smaller than electrical conductivity on the surface on which metal is subjected to metal processing on both sides thereof.

In the noise absorbing fabric of the present invention, the base material is a fabric that is a fiber assembly. The use of a fabric for the base material makes it possible for the base material to be have ample flexibility and flexibility, and have a more complex shape in the case of incorporating in an electronic device, thereby making it possible to arrange at a location where noise from highly integrated electronic components is generated in the housing of an electronic device.

Furthermore, in the present description, in the case of simply referring to a "fabric", the fabric refers to that not having metal subjected to metal processing, while in the case of referring to a "noise absorbing fabric", the fabric refers to that having metal subjected to metal processing.

Figure 4:
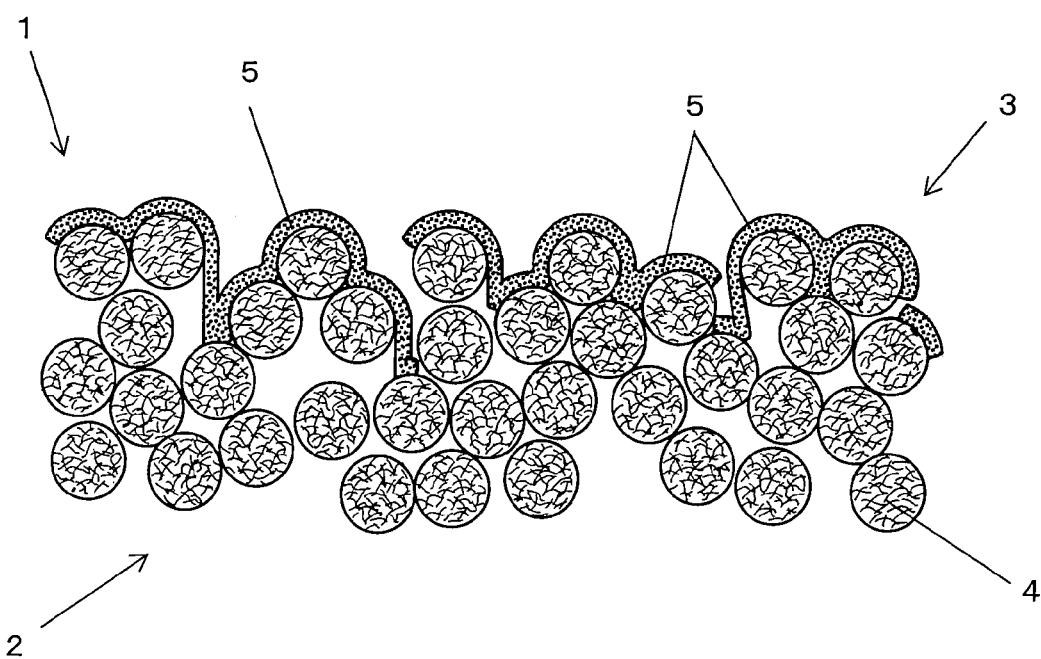
FIG. 4 is a drawing for explaining a metal cluster.

In addition, employing a fabric in the form of a fiber assembly for the base material enables the metal-processed metal to contain a plurality of metal clusters. FIG. 4 is a drawing for explaining a metal cluster. The noise absorbing fabric 1 of FIG. 4 contains the fabric 2 and the metal-processed metal 3, and the metal-processed metal 3 is composed of a plurality of metal clusters. The metal clusters 5 each have different electrical resistance values, may also have a switching effect, and have higher noise absorbing ability.

Furthermore, in FIG. 4, all of the fiber cross-sections are represented as being circular in the same manner as FIG. 3.

Selection of a fabric in the form of a fiber assembly for the base material of the aforementioned noise absorbing fabric further increases the number of interlacing points thereof thereby making it possible to demonstrate higher performance.

In addition, since the surface of the fabric is not smooth, in the case of subjecting the metal to metal processing from one direction, a plurality of metal clusters are formed and electrical resistance values differ by location on a microscopic level. Thus, as a result electromagnetic waves that have penetrated from the outside being captured by the metal clusters having fixed electrical conductivity and electrical resistance values, converted to electrical current and subsequently converted to thermal energy due to electrical resistance, the noise absorbing properties of the fabric are demonstrated. This point differs considerably from conventional materials such as films and sheets having a smooth surface. Namely, in the case of materials in which metal is subjected to metal processing by metal deposition and the like on a smooth surface such as that of a film or sheet, the surface subjected to metal processing is smoother, and the large electrical conductivity inherently possessed by metal ends up being demonstrated, namely the common logarithmic value of surface resistivity easily becomes less than 0 resulting in increased likelihood of electromagnetic waves being reflected. In addition, since it is difficult to process the surfaces of films or sheets to be heterogeneous, problems involving cost arise in the case of heterogeneous processing.

Since the fabric used in the present invention is a fiber assembly, has a large number of interlacing points between fibers, and the surface thereof is heterogeneous (appears to have curvature when viewed from one direction), when subjected to metal processing by metal deposition and the like, metal clusters having greater electrical heterogeneity are formed, and since electromagnetic waves are more efficiently consumed by electrical resistance once they have been captured, the noise absorbing fabric of the present invention is able to have extremely high noise absorbing ability.

The fabric used in the present invention is preferably a non-woven fabric, and the fibers that form the non-woven fabric are preferably synthetic long fibers.

In the case of fabrics such as woven fabrics or knitted fabrics, a large proportion of the fibers are oriented in the vertical or horizontal direction, for example, of the fabric. In this case, in a noise absorbing fabric formed by subjecting a metal to metal processing on the fabric, the metal is also oriented in a fixed direction thereby imparting fixed directivity to the noise absorbing properties thereof. Thus, in the case of noise originating from a fixed direction, a fabric having fibers oriented in a fixed direction, such as a woven fabric or knit fabric, is preferable. On the other hand, in the case noise originates from various directions as in typical electronic devices, a fabric in which fibers are not oriented in a fixed direction, such as a non-woven fabric, is preferable.

In addition, not having fibers oriented in a fixed direction inhibits reflection making it possible to demonstrate higher noise absorbing properties. Thus, an aspect in which the fabric used in the present invention is a non-woven fabric is more preferable.

In addition, in the case of using in an electronic device, there are many cases in which the noise absorbing fabric of the present invention is used by stamping out to a complex shape according to the shape of an electronic component or circuit line, and then affixed to the electronic component or circuit line or affixed to a housing of the electronic component. When using a woven fabric or knit fabric, in the case of stamping out to a complex shape, there are cases in which fiber fragments are formed on the ends of the stamped out portions. In the case these fiber fragments are present when metal is subjected to metal processing, there is the risk of short-circuiting that can lead to malfunctioning of electronic components.

The fabric used in the present invention is more preferably a fabric that has been formed by heat. When the fabric is produced by adding a binder, there are cases in which the binder migrates to the electronic device and causes a malfunction. Thus, the fabric is preferably a synthetic long fiber non-woven fabric formed by heat without using a binder. On the other hand, from the viewpoint of making the process used to produce the fabric more feasible, forming the fabric by heat is also preferable since it enables costs to be further reduced.

In the present invention, the fibers that compose the fabric are preferably synthetic fibers that enable the fabric to be formed by heat. In addition, chemical fibers such as rayon fibers may easily contain water due to their hydrophilic properties. If the contained water is re-released, it can cause a malfunction of the electronic device, thereby making this undesirable.

Specific examples of fibers that compose the fabric used in the present invention include fibers formed from polyolefins such as polypropylene or polyethylene, polyalkylene terephthalate resins (such as PET, PBT or PTT) and derivatives thereof, polyamide-based resins such as N6, N66 or N612 and derivatives thereof, polyoxymethylene ether-based resins (such as POM), PEN, PPS, PPO, polyketone resins and polyketone-based resins such as PEEK, thermoplastic polyimide resins such as TPI, and combinations thereof.

Although the aforementioned fibers can be suitably selected corresponding to the environment in which the noise absorbing fabric of the present invention is applied, the fibers can be selected, for example, in the manner indicated below.

Since polyamide-based resins such as N6, N66 or N612 have a high water absorption rate, their application to electronic components having an extreme aversion to water in is preferably avoided in comparison with other resins. In cases requiring soldering heat resistance or when there is the potential for the occurrence of problems caused by heat generated from electronic components and the like, namely in electronic devices requiring heat resistance, fibers formed from PET-based resin, PPS-based resin or PEEK-based resin are used preferably. On the other hand, when considering electrical properties such as dielectric constant or tan δ, polyolefin resin, PET-based resin, PPS-based resin, PPO-based resin, PEEK-based resin and fluorine-based resins are preferable.

The aforementioned fibers preferably have flame resistance. This is because fibers that are resistance to combustion by fire should be employed from the viewpoint of safety of electronic components.

Although varying according to the environment in which the noise absorbing fabric of the present is applied, normally the fiber diameter of the aforementioned fibers is preferably 50 μm or less. This is because this allows the obtaining of a fabric having a uniform distance between fibers, thereby reducing leakage of electromagnetic waves resulting from their passage through the noise absorbing fabric, for example. In addition, the fibers also have high strength, thereby enabling the fabric to be processed and used stably since there is little likelihood of the fabric or noise absorbing fabric from tearing during the metal processing step or in the environment in which the fabric is used.

In the noise absorbing fabric of the present invention, the fabric preferably contains a layer of fibers having a fiber diameter of 7 μm or less (to be referred to as "microfibers"). As a result of containing these microfibers, the number of fibers per unit surface area increases and the specific surface area of the fibers becomes larger, thereby resulting in an increase in specific surface area of the meal layer as well and further enhancing noise absorbing ability. In addition, since the noise absorbing fabric of the present invention becomes thinner as a result of containing a layer of microfibers, it is preferable for use in electronic devices desired to be made lighter, thinner, shorter and smaller. In addition, reducing the thickness of the noise absorbing fabric of the present invention also enables a sheet to be bent more flexibly, thereby similarly facilitating installation in electronic devices as well as facilitating the demonstration of greater noise absorbing ability. The fabric used in the present invention preferably contains a layer of fibers having a fiber diameter of 7 μm or less, and more preferably contains a layer of fibers having a fiber diameter of 4 μm or less.

The fiber diameter of the aforementioned microfibers is preferably 0.01 μm or more and more preferably 0.05 μm or more.

The aforementioned microfibers are preferably produced by a method such as melt blowing or electrospinning, and are more preferably produced by melt blowing.

In addition, fibers in the noise absorbing fabric of the present invention preferably have a random orientation instead of being oriented in a fixed direction as previously described.

In the case of a fabric composed of microfibers, since the strength of the fabric tends to be low, it is preferable to combine the use thereof with a fabric having a fiber diameter greater than that of the microfibers, namely fibers having a fiber diameter in excess of 7 μm (to be referred to as "ordinary fibers").

Although there are no particular limitations on the cross-sectional shape of the fibers that compose the fabric used in the present invention, in order to form a more heterogeneous surface, the fibers preferably have a modified cross-section or separated cross-section. In addition, the fibers may be crimped or twisted for the same purpose.

Although there are no particular limitations on the tensile strength of the fabric used in the present invention, it is preferably 10 N/3 cm or more based on handling ease in the metal processing step and during use the noise absorbing fabric. If the tensile strength is 10 N/3 cm or more, there is less likelihood of the fabric tearing or wrinkles forming in the vacuum deposition, sputtering or other metal processing step, thereby enabling the metal to be processed more efficiently and allowing the production of a noise absorbing fabric that is free of problems during the course of use. The aforementioned tensile strength is more preferably 20 N/3 cm or more.

Furthermore, the aforementioned tensile strength refers to the value obtained by measuring in accordance with JIS L-1906:2000 5.3, except for using a test piece having a width of 3 cm.

The thickness of the fabric used in the present invention is preferably within the range of 10 μm to 400 μm and more preferably within the range of 15 μm to 200 μm. If the thickness of the fabric is less than 10 μm, suitable strength and rigidity may not be obtained during metal processing, it may be difficult to carry out metal processing, and there may also be cases in which the metal may pass through during metal processing resulting in contamination of the equipment. Moreover, there are cases in which the strength of a stamped noise absorbing fabric may be weak. In addition, if the thickness of the fabric exceeds 400 µm, rigidity may be excessively high during metal processing. Moreover, it is may be difficult to insert, bend or fold the noise absorbing fabric in confined locations because of being excessively thick, thereby making it difficult to install in an electronic component.

The thickness of the fabric as described above can be measured in accordance with the provisions of JIS L-1906: 2000.

The basis weight of the fabric used in the present invention is preferably within the range of 7 g/m² to 300 g/m² and more preferably within the range of 15 g/m² to 150 g/m². If the basis weight is less than 7 g/m², the metal may pass through during metal processing resulting in contamination of the equipment. Moreover, the strength of the noise absorbing fabric of the present invention may be weak, making it difficult to use in processing, stamping and other steps. If the basis weight exceeds 300 g/m², the noise absorbing fabric of the present invention may be excessively heavy. In the case the basis weight is within the range of 7 g/m² to 300 g/m², the noise absorbing fabric of the present invention is able to retain its shape and have favorable ease of handling.

The aforementioned basis weight can be measured in accordance with the method of JIS L-1906:2000.

The fabric used in the present invention preferably has a mean pore size of 0.5 µm to 5.0 mm and more preferably has a mean pore size of 0.5 µm to 3.0 µm. If the mean pore size is less than 0.5 µm, gaps between fibers are excessively small, the metal clusters are not separated by suitable distance, and the flow of electrical current is not impaired. In addition, since adjacent fibers are not suitably separated, namely since the interlacing points between fibers do not increase, noise absorbing properties realized by switching effects are not enhanced. On the other hand, if the mean pore size exceeds 5 mm, the gaps between fibers become excessively large, the metal cannot be uniformly processed during metal processing, and it becomes difficult to obtain a target electrical resistance value. There are also cases in which problems occur in equipment during metal processing. In the case of employing a physical deposition method for metal processing in particular, the metal easily passes through to the back resulting in increased likelihood of contamination of equipment. In addition, in the case the mean pore size is 1 mm or less, the number of interlacing points between fibers increases and noise absorbing properties can be further enhanced due to the resulting switching effects. Thus, the mean pore size is more preferably 0.5 µm to 1.0 mm, even more preferably 0.5 µm to 500 µm, and most preferably 0.5 µm to 200 µm.

The aforementioned mean pore size can be measured in accordance with the method described in the examples.

There are no particular limitations on the production method of fabric used in the present invention, and the fabric can be produced by various production methods. In addition, the fabric is preferably subjected to calendering in order to have a suitable surface structure. Since calendering results in the formation of suitable surface irregularities in the surface of the fabric, it allows the noise absorbing fabric of the present invention to have favorable electrical conductivity as well as a suitable surface resistance value after metal processing. Namely, since the fabric in the form of a fiber assembly is flattened while retaining the shape of the fibers and not having a homogeneous surface to the extent of a film, the noise absorbing fabric of the present more readily has a cluster structure to be subsequently described following metal processing, thereby further enhancing noise absorbing ability.

In the present invention, "metal processing" refers to adhering a metal, and more specifically, refers to arbitrary treatment capable of adhering a metal on a fabric and/or within a fabric, and depending on the case, within fibers that compose the fabric, specific examples of which include physical metal deposition (including deposition such as EB deposition, ion plating or ion sputtering, and high-frequency methods such as magnetron deposition or opposed-target magnetron deposition) and chemical plating (such as electroless plating and electrolytic plating). Since physical metal deposition methods consist of fine particles of metal on a fabric being adsorbed from the surface of the fabric and enables the status of metal deposition to be controlled according to the deposition conditions, it facilitates the formation of an electrical conductivity gradient between the surface and inside of the noise absorbing fabric of the present invention. In addition, since the surfaces of individual fibers have curvature, the use of a physical deposition method in which the particle generation source is in a single direction is preferable since it facilitates the formation of suitable localized thick spots of metal on individual fibers.

Figure 5:
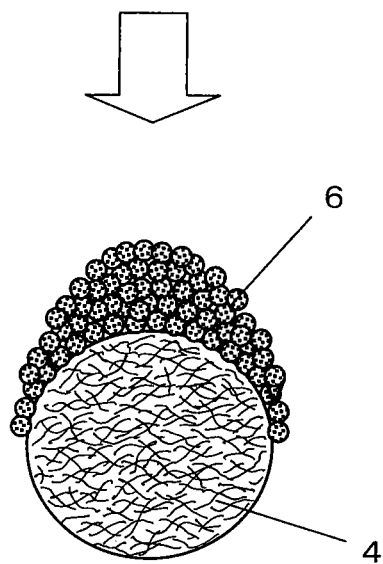
FIG. 5 is a schematic diagram showing one aspect of a state in which metal particles are laminated on a fiber by metal deposition.

FIG. 5 is a schematic drawing showing one aspect of a laminated state in which metal particles are laminated on a fiber. In FIG. 5, in the case of carrying out physical deposition from above, metal particles 6 are heterogeneously formed on the fiber 4. In this case, electromagnetic wave capturing properties differ between those portions where the metal-processed metal is thick and those portions where it is thin, and since the metal particles 6 are localized when observed from the viewpoint of electrical resistance, the captured electromagnetic waves become electrical current, and this electrical current is converted to thermal energy due to electrical resistance when the current flows through the aforementioned portions, and noise absorbing ability is predicted to increase.

On the other hand, in the case of using a plating method for the aforementioned metal processing, since metal is plated over the entire fabric and metal is laminated with a considerable degree of homogeneity on individual fibers, it is difficult to form localized areas of electrical conductivity. Thus, physical metal deposition is more preferable for the aforementioned metal processing.

There are no particular limitations on the metal deposition method, and any arbitrary method can be selected. For example, a fabric in which a metal is to be subjected to metal processing is placed in a deposition device having a fixed degree of vacuum, the fabric is fed to the device at a constant speed, and the metal is physically deposited with a deposition source. In the case of EB deposition, for example, the metal is micronized with energy of about 1 EV, and the microparticles are physically adsorbed onto the fabric. In the case of ion plating, since deposited particles can be accelerated and physically deposited with a rare gas and a level of energy greater than that of EV deposition, the metal can be deposited deeper in the fabric. On the other hand, in the case of sputtering, metal is allowed to accumulate at a higher energy level due to the effects of a magnetic field, thereby enabling metal to not only be deposited deeper in the fabric but also within the fibers depending on the case. In this case, since an electrical conductivity gradient is also created within the fibers, noise absorbing ability increases. In summary, although there is less damage to the fabric and fibers when using a mild deposition method such as EB deposition, the strength at which the metal is physically adsorbed to the fiber surfaces is weak. On the other hand, in the case of more vigorous deposition methods such as sputtering, although there is greater damage to the fabric and fibers, the strength at which the metal is physically adsorbed to the fiber surfaces increases. The deposition method can be suitably selected corresponding to the application of the noise absorbing fabric of the present invention.

In the present invention, there are no particular limitations on the metal subjected to metal processing provided it has electrical conductivity, and examples thereof include metals such as aluminum, tantalum, niobium, titanium, molybdenum, iron, nickel, cobalt, chromium, copper, silver, gold, platinum, lead, tin, tungsten and SUS, as well as oxides and nitrides thereof and mixtures thereof.

In the case of metals such as aluminum and tantalum having a so-called valve action, namely metals that easily allow the obtaining of an oxide film on the surface only and do not allow an oxide layer to easily propagate inside the metal, a thin oxide film is formed having slightly lower electrical conductivity. If a metal having the aforementioned valve action is employed for the metal to be subjected to metal processing in the noise absorbing fabric of the present invention, a microscopic electrical conductivity gradient is formed on the surface and on the inside thereof, making this desirable since it enables noise absorbing ability to be improved. In addition, the use of a metal having valve action facilitates the maintaining of a constant surface resistivity value without excessively promoting oxidation of the metal during the course of use. Although easily oxidized metals initially demonstrate favorable surface resistance values, depending on the usage environment (such as a high humidity environment or high temperature environment), oxidation proceeds easily and surface resistance values increase, thereby resulting in the risk of being unable to demonstrate their inherent level of performance. In addition, in the case of metals such as gold, silver or copper that have extremely high electrical conductivity and allow uniform electrical conductivity to be obtained even after metal processing, it is difficult to control the metal processing, and there are cases in which electrical conductivity increases in the same manner as a film or sheet.

On the other hand, in the present invention, the metal used for the aforementioned metal processing may or may not have paramagnetic properties or soft magnetic properties. This point differs considerably from inventions of the prior art, and as such, the object of the present invention is not to absorb noise macroscopically by utilizing magnetic properties, but rather is to absorb noise by utilizing electrical conductivity. For example, magnetic compounds such as iron and nickel permalloy having high magnetic permeability. Consequently, metal compounds such as ferrite, iron or nickel were mainly used in the prior art while focusing on these metal compounds. In the case of conventional noise absorbing sheets, noise absorbing ability was demonstrated according to the performance of microparticles of these metal compounds having soft magnetic or magnetic properties. Consequently, the degree of their magnetic permeability served as the foremost physical indicator that influenced their performance.

From the aforementioned viewpoint, although to be subsequently described, in the case a finished product demonstrates noise absorbing ability due to a loss of magnetic properties, it is preferable to select a metal having high magnetic permeability. Examples of metals having high magnetic permeability include iron, nickel and cobalt, as well as metal compounds such as oxides and nitrides thereof.

On the other hand, in the case of a product having aversion to magnetic properties, a metal other than a metal having high magnetic permeability, or a metal compound thereof, is preferable, and metals not having magnetic properties, as well as metal compounds such as oxides or nitrides thereof, are particularly preferable. Differing from noise absorbing products of the prior art that contain a metal having high magnetic permeability, a more preferable embodiment of the present invention is a noise absorbing fabric that can be applied to products having an aversion to magnetic properties and contains a metal that does not have magnetic properties.

There are no particular limitations on the production method of the fabric used in the present invention, and can be produced by a method used to produce ordinary woven fabrics, knitted fabrics or non-woven fabrics. In the case the fabric used in the present invention is a non-woven fabric, a method used to produce synthetic long fibers such as spun bonding, melt blowing or flash spinning is preferable. In addition, in the case the fabric used in the present invention is a non-woven fabric, a method used to produce short fibers such as papermaking or a dry method can also be used. In the case the fabric used in the present invention is a non-woven fabric, a noise absorbing fabric having high strength that is easily processed can be more preferably produced by a method in which a non-woven fabric is produced using synthetic fibers.

In addition, a laminated non-woven fabric is preferably used for the fabric used in the present invention that is formed by laminating a layer of a non-woven fabric composed of microfibers and a layer of a non-woven fabric composed of ordinary fibers. The aforementioned microfibers and ordinary fibers are preferably composed of a thermoplastic resin, and tensile strength, flexibility and heat-resistant stability of the laminated non-woven fabric can be maintained by integrating the layer of non-woven fabric composed of microfibers and the layer of non-woven fabric composed of ordinary fibers by thermal embossing. An example of the aforementioned laminated non-woven fabric is that produced by laminating a layer of a spun-bond non-woven fabric, a layer of a melt blown fabric, and a layer of a spun-bond non-woven fabric in that order, followed by compression bonding with an embossing roller or hot press roller.

In the aforementioned laminated non-woven fabric, at least one layer of a spun-bond non-woven fabric are spun using a thermoplastic synthetic resin, and at least one layer of a non-woven fabric composed of microfibers having a fiber diameter of 0.01 µm to 7 µm is blown thereon by melt blowing using a thermoplastic synthetic resin. Subsequently, the laminated non-woven fabric is preferably produced by integrating the layers by compression bonding using an embossing roller or flattening roller.

Moreover, the laminated non-woven fabric is more preferably produced by laminating at least one layer of a thermoplastic synthetic long fiber non-woven fabric using a thermoplastic synthetic resin on a melt blown non-woven fabric prior to thermocompression bonding, followed by integrating the layers by compression bonding using an embossing roller or flattening roller.

In the aforementioned laminated non-woven fabric, since a layer of non-woven fabric composed of microfibers is blown directly onto a layer of non-woven fabric composed of thermoplastic synthetic long fibers by melt blowing, the microfibers are able to penetrate into the layer of non-woven fabric composed of thermoplastic synthetic long fibers as a result of melt blowing, and are able to fill in the gaps between fibers of the layer of non-woven fabric composed of thermoplastic synthetic long fibers. As a result, since the microfibers penetrate into the non-woven fabric composed of thermoplastic synthetic long fibers and are fixed therein as a result of melt blowing, not only is the strength of the structure per se of the laminated non-woven fabric improved, but there is less susceptibility to migration of the layer of non-woven fabric composed of microfibers caused by external force, thereby resulting in increased resistance to interlayer separation. Examples of methods used to produce the aforementioned laminated non-woven fabric are disclosed in International Publication No. WO 2004/94136 and International Publication No. WO 2010/126109.

In the case of a laminated non-woven fabric obtained by laminating a spun-bond non-woven fabric layer and a melt blown non-woven fabric layer, for both three-layer laminated non-woven fabrics and two-layer laminated non-woven fabrics, the combined basis weight of the spun-bond non-woven fabric layers is preferably 1.0 g/m² to 270 g/m², the basis weight of the melt blown non-woven fabric layer is preferably 0.3 g/m² to 270 g/m², and the overall basis weight is preferably 7 g/m² to 300 g/m². The combined basis weight of the spun-bond non-woven fabric layers is more preferably 3.0 g/m² to 100 g/m², the basis weight of the melt blown non-woven fabric layer is more preferably 0.5 g/m² to 120 g/m², and the overall basis weight is more preferably 15 g/m² to 150 g/m².

In addition, the fiber diameter of the fibers of the spun-bond non-woven fabric layer is preferably 4 µm to 50 µm, more preferably 5 µm to 40 µm, and even more preferably 6 µm to 35 µm.

The fiber diameter of fibers of the melt blown non-woven fabric layer is preferably 7 µm or less and more preferably 4 µm or less. The fiber diameter of fibers of the melt blown non-woven fabric layer is preferably 0.01 µm or more and more preferably 0.05 µm or more.

The noise absorbing ability of the noise absorbing fabric of the present invention is based on a concept that clearly differs from the previously described prior art, and the noise absorbing fabric of the present invention is able to demonstrate high noise absorbing ability even in the case of low magnetic permeability, and in the extreme, even in the case of a typical value of magnetic permeability of nearly zero. This is because the noise absorbing fabric of the present invention demonstrates noise absorbing ability due to the presence of an electrical conductivity gradient. As was previously described, by subjecting the surface of a fabric containing microfibers to a prescribed metal processing, the area of the metal-processed surface increases, thereby resulting in enhanced noise absorbing ability.

In addition, electromagnetic waves that cause noise can be broadly divided into an electric field component and a magnetic field component (although their mechanisms differ slightly between a near field and a far field), and the noise absorbing fabric of the present invention demonstrates effects on the electric field component in particular. Namely, the noise absorbing fabric of the present invention is thought to demonstrate noise absorbing ability due to a loss of electrical conductivity. On the other hand, in the case of fabrics having magnetic properties by incorporating a soft magnetic material and the like, noise absorbing properties are thought to be demonstrated due to a loss of magnetic properties. However, in electromagnetic waves that cause noise, since the electric field component and the magnetic field component are actually two sides of the same coin, overall noise absorbing ability increases by demonstrating effects against either component.

The following lists examples in which the use of a metal not having magnetic properties in the noise absorbing fabric of the present invention is advantageous. Examples of devices recently used in electronic equipment include magnetic sensors, electronic compasses, CDs and DVDs. A noise absorbing fabric that contains a metal having magnetic properties cannot be used in combination with magnetic sensors or electronic compasses. In addition, in devices that read and write information (pickup devices) from a storage medium based on magnetism in the manner of CDs and DVDs, since the reading of information is nearly exclusively carried out magnetically by a pickup device that reads information by storing information according to the presence or absence of magnetism, the proximity of a metal having magnetic properties in these devices results in increased susceptibility to reading errors. Consequently, although noise absorbing sheets used in recent years that contain soft magnetic particles or magnetic particles and the like were unable to be used in these devices, the noise absorbing fabric of the present can be used in these devices since it contains metal that does not have magnetic properties.

However, the present description does not preclude noise absorbing ability resulting from the use of a magnetic material, and on the contrary, a higher level of noise absorbing ability can naturally be demonstrated by combining with the noise absorbing ability of a magnetic material provided surface resistivity is within a prescribed range. For example, the performance of the noise absorbing fabric of the present invention can be further enhanced by subjecting a portion where noise is generated attributable to magnetic properties to metal processing with a metal having magnetic properties. In addition, the noise absorbing fabric of the present invention can also contain a magnetic sheet containing a soft magnetic material.

In the present invention, although there are no particular limitations on the thickness of the aforementioned metal provided the common logarithmic value of the surface resistivity of the surface subjected to metal processing is within the range of 0 to 4, in general, the thickness of the metal is preferably within the range of 2 nm to 400 nm and more preferably within the range of 5 nm to 200 nm. If the thickness of the metal is less than 2 nm, there are cases in which electrical conductivity is susceptible to being outside the aforementioned range. Namely, there are cases in which there are portions where the metal is not formed during metal processing thereby causing the common logarithmic value of surface resistivity to exceed 4. On the other hand, if the thickness of the metal exceeds 400 nm, the thickness of the metal becomes excessively large resulting in the possibility of excessive flow of electric current. Namely, if the metal is excessively thick, a homogeneous layer is formed, gaps between fibers are filled in and there are hardly any gaps left between the fibers, thereby resulting in increased susceptibility to a decrease in noise absorbing ability attributable to switching effects.

Furthermore, in the present description, the thickness of the metal can be measured from SEM micrographs.

In the noise absorbing fabric of the present invention, in the case the aforementioned metal-processed metal contains a plurality of metal clusters, the metal clusters preferably have an arithmetic mean value of the major axis thereof of 2 to 200 nm, and more preferably have an arithmetic mean value of the major axis thereof of 5 nm to 100 nm. As a result of the metal-processed metal having discontinuous clusters, an electrical conductivity gradient is easily formed between individual metal clusters. If the arithmetic mean value of the major axis of the metal clusters is 2 nm or more, noise can be absorbed more efficiently. In addition, if the arithmetic mean value of the major axis of the metal clusters is 200 nm or less, the homogenization of the metal-processed metal is not excessively promoted, thereby allowing the formation of a favorable electrical conductivity gradient. In a noise absorbing fabric containing microfibers, even higher noise absorbing ability can be demonstrated due to ease of forming the aforementioned cluster structure.

The aforementioned major axis can be measured from images obtained with an SEM electron microscope.

The following treatment can be carried out on the noise absorbing fabric of the present invention on one or both sides thereof for the purpose of practical application in an electronic device and the like. For example, insulating treatment can be carried out to prevent short-circuiting. More specifically, the noise absorbing fabric can be coated with a resin, laminated with a resin or be affixed to an insulating film. In addition, treatment for imparting adhesion for attaching to an electronic device or the providing of bolt or screw holes for installing in the housing of an electronic device can also be carried out. Treatment for imparting adhesion for affixing to an electronic device is preferable since it allows the noise absorbing fabric to be fixed more easily to an electronic device.

As is indicated below, the noise absorbing fabric of the present invention is able to absorb noise by being applied to an electronic device and the like. For example, it can be affixed to an electronic component such as an LSI, to a circuit such as an FPC or to the back thereof, to a transmission line of a circuit or a site where an electronic component is mounted to a circuit, to a connector or a cable extending from a connector used to connect other devices or components, or to the back or front of a housing or support containing an electronic component or device, and it can be wound around a power line, transmission line or other type of cable.

In addition, in consideration of ease of use, a pressure-sensitive adhesive layer (consisting of an adhesive such as a hot melt adhesive or ordinary pressure-sensitive adhesive) can be provided on the front or back for affixing to the aforementioned electronic device as desired, and in cases requiring insulating properties, an electrical insulating layer (that it is laminated with a film and can be provided with a polymer laminate to form an insulating layer by combining with another insulating material) can be provided on the front or back of the aforementioned electronic device and the like.

EXAMPLES

Although the following provides a more detailed explanation of the present invention by listing examples thereof, the present invention is not limited to these examples.

The measurement and evaluation methods used are as described below.

[(1) Microstrip Line (MSL) Method]

Figure 6:
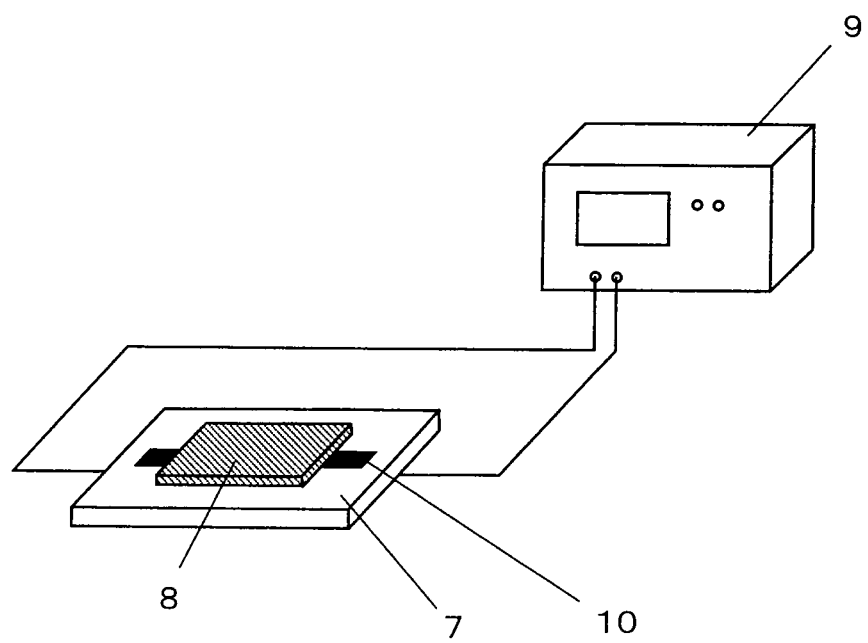
FIG. 6 is a drawing for explaining a microstrip line method.
Figure 7:
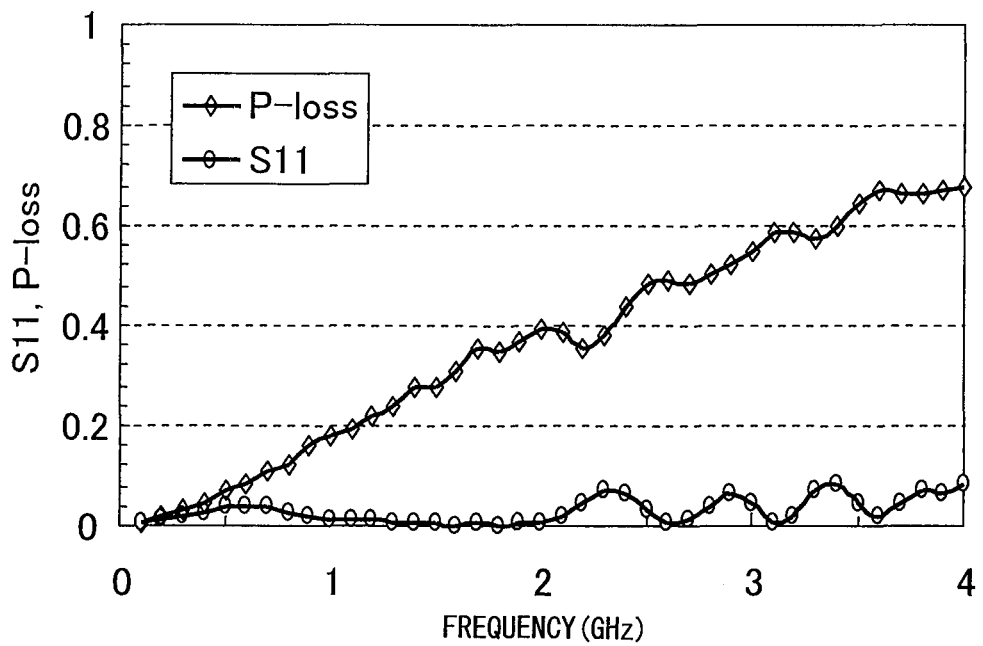
FIG. 7 is a drawing showing measurement results obtained according to the microstrip line method in Example 1.
Figure 8:
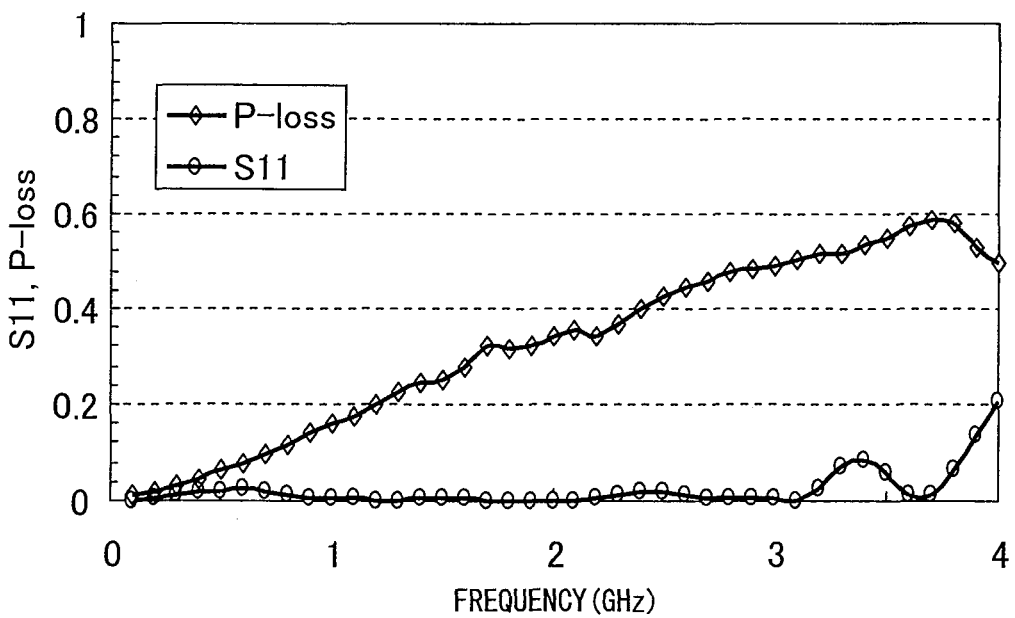
FIG. 8 is a drawing showing measurement results obtained according to the microstrip line method in Example 4.
Figure 9:
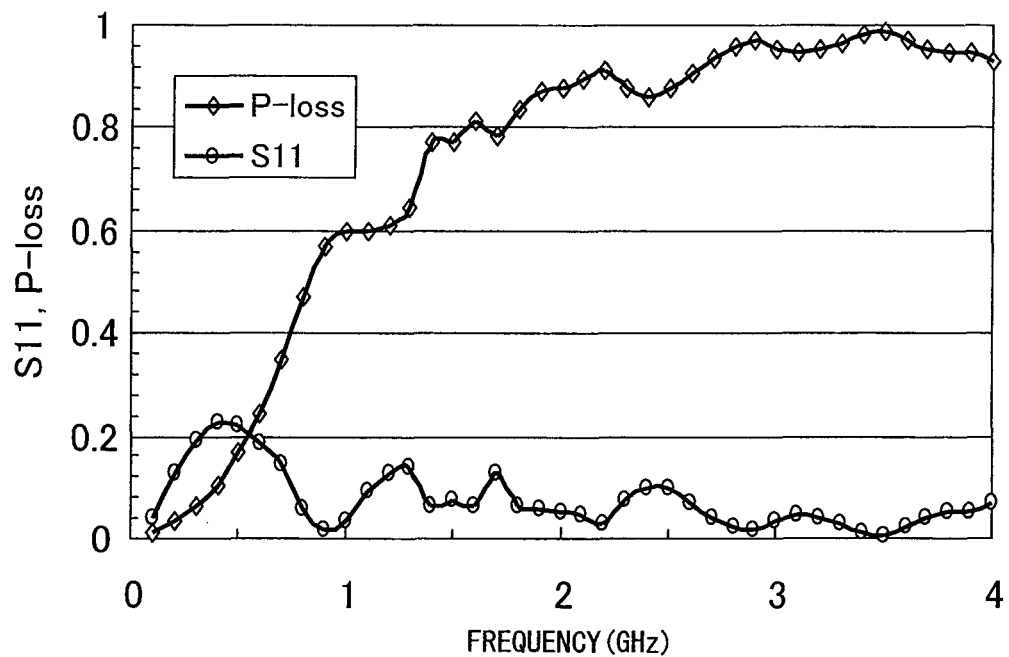
FIG. 9 is a drawing showing measurement results obtained according to the microstrip line method in Example 6.
Figure 10:
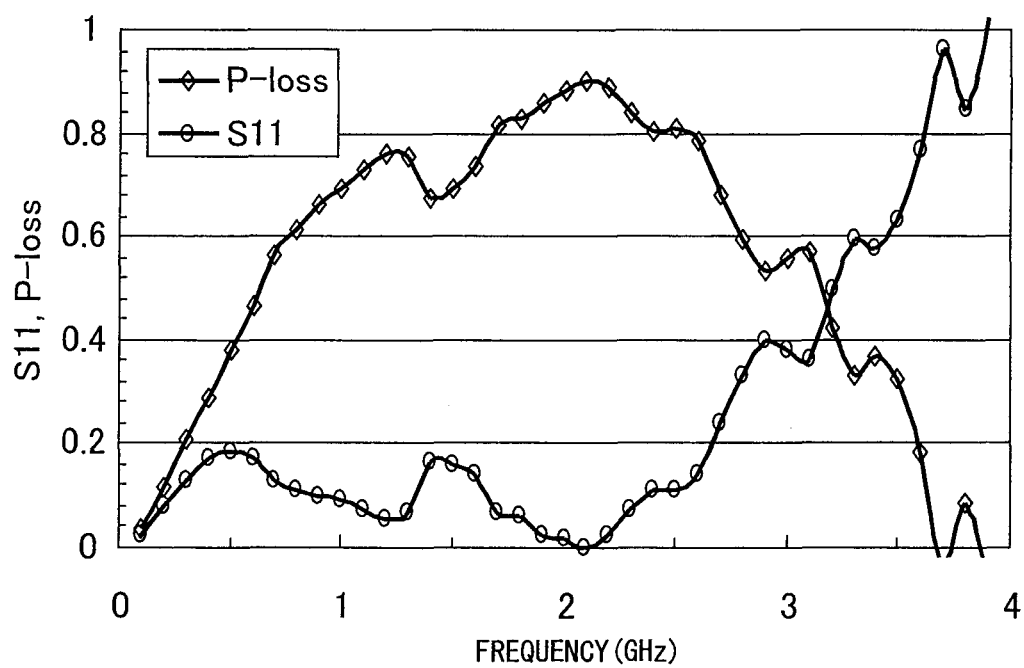
FIG. 10 is a drawing showing measurement results obtained according to the microstrip line method in Comparative Example 6.

Measurements were carried out using the microstrip line method in compliance with IEC standard 62333-2. As shown in FIG. 6, measurements were carried out according to S-parameter method using a microstrip line fixture 7 having impedance of 50Ω (Microwave Factory Corp.) and a network analyzer 9 (Model N5230C, Agilent Technologies Inc.). The size of a sample 8 of noise absorbing fabric was 5 cm×5 cm, and the sample 8 was measured by placing on the microstrip line fixture 7. Furthermore, in FIG. 6, reference symbol 10 indicates a microstrip line.

Reflection attenuation (S11) and transmission attenuation (S21) were measured at each frequency followed by calculation of loss ratio from the following equation (1).

$$\text{Loss ratio } (Ploss/Pin) = 1 - (S11^2 + S21^2)/1 \qquad (1)$$

[(2) Surface Resistivity]

Surface resistivity was measured with the four-terminal method using the Loresta GP Model MCP-T600 Low Resistance Meter manufactured by Mitsubishi Chemical Corp. Measurements were carried out for n=3 followed by determination of the average value thereof for use in evaluation.

[(3) Loop Antenna Method A]

Figure 11:
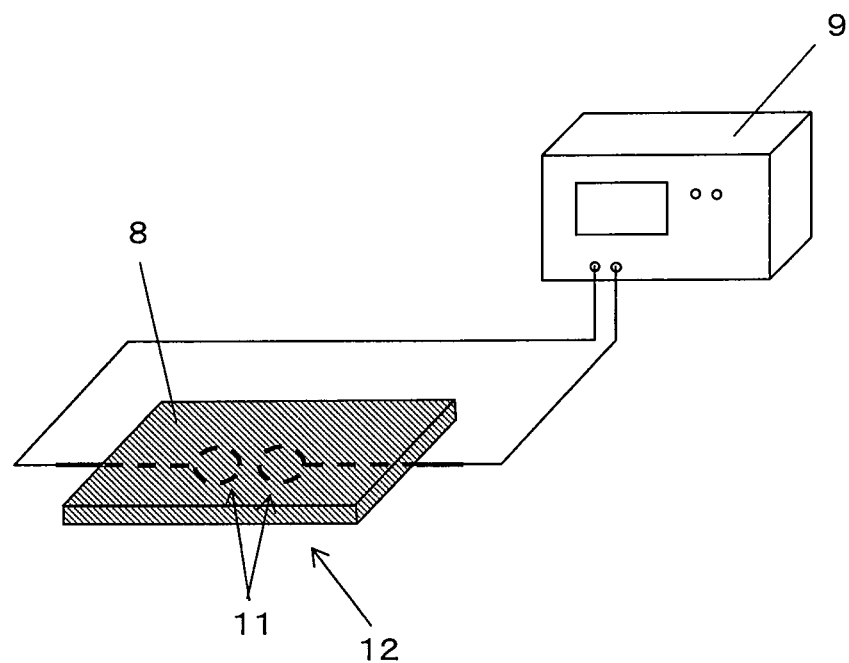
FIG. 11 is a schematic diagram for explaining a loop antenna method A.

Measurements were carried out using the microloop antenna method in compliance with IEC standard 62333-2. As shown in FIG. 11, measurements were carried out according to S-parameter method using a microloop antenna fixture 12 having two microloop antennas 11 (Microwave Factory Corp.) and the network analyzer 9 (Model N5230C, Agilent Technologies Inc.). The size of the sample 8 of noise absorbing fabric was 5 cm×5 cm, and coupling attenuation was measured by placing the fabric on the two microloop antennas 11.

[(4) Loop Antenna Method B]

Figure 12:
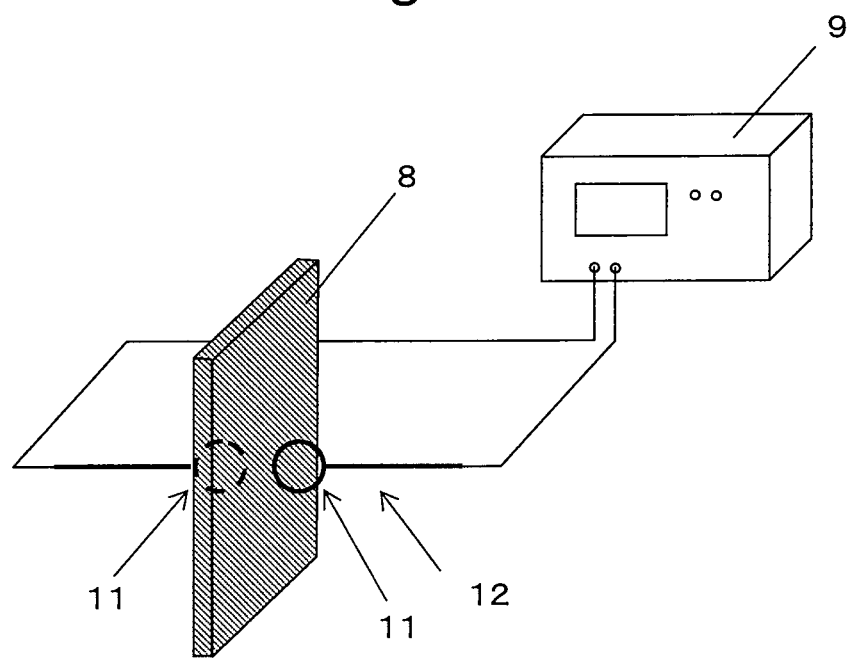
FIG. 12 is a schematic diagram for explaining a loop antenna method B.

Measurements were carried out using the microloop antenna method in compliance with IEC standard 62333-2. As shown in FIG. 12, measurements were carried out according to S-parameter method using the microloop antenna fixture 12 having the two microloop antennas 11 (Microwave Factory Corp.) and the network analyzer 9 (Model N5230C, Agilent Technologies Inc.). The size of the sample 8 of noise absorbing fabric was 5 cm×5 cm, and transmission attenuation was measured by placing the fabric between the two microloop antennas 11.

[(5) Noise Absorption Visualization Device (Measurement of Magnetic Field Strength)]

Magnetic field strength was measured using a printed circuit board electromagnetic wave analysis system (Model ESV-3000, Noise Laboratory Co., Ltd.). A demo board manufactured by Noise Laboratory Co., Ltd. was used for the printed circuit board used during measurements. A vertical magnetic field probe manufactured by Noise Laboratory Co., Ltd. was used for the measurement probe. The measuring frequency ranged from 100 MHz to 400 MHz, the values of peak magnetic field strength within that frequency range were mapped for each measurement point. The size of the sample was 8 cm×8 cm, and magnetic field strength attenuation was measured from the difference in magnetic field strength before and after affixing the sample to the demo board.

[(6) Noise Absorption Visualization Device (Measurement of Electric Field Strength)]

Electric field strength was measured using a printed circuit board electromagnetic wave analysis system (Model ESV-3000, Noise Laboratory Co., Ltd.). A demo board manufactured by Noise Laboratory Co., Ltd. was used for the printed circuit board used during measurements. A vertical magnetic field probe manufactured by Noise Laboratory Co., Ltd. was used for the measurement probe. The measuring frequency ranged from 250 MHz to 700 MHz, the values of peak electric field strength within that frequency range were mapped for each measurement point. The size of the sample was 8 cm×8 cm, and electric field strength attenuation was measured from the difference in electric field strength before and after affixing the sample to the demo board.

[(7) Magnetic Permeability Measurement Method]

Magnetic permeability was measured using a thin film magnetic permeability measurement system (Model PMF-3000, Ryowa Electronics Co., Ltd.). Measurements were carried out by affixing the sample to a PET resin sheet with double-sided adhesive tape (NW-5, Nichiban Co., Ltd.) in order to immobilize the sample. Measurements were carried out for n=3 followed by determination of the average value thereof for use in evaluation.

[(8) Mean Pore Size (μm)]

Mean pore size was measured using the Perm-Porometer (Model CFP-1200AEX) manufactured by PMI Inc. Measurements were carried out by using SilWick manufactured by PMI Inc. for the immersion liquid and immersing the sample in the immersion liquid followed by adequately deaerating the sample.

This measuring device measures pore size as calculated from the pressure required to rupture a liquid film and the surface tension of the liquid by immersing a filter in a liquid having a known surface tension, and applying pressure to the filter after all pores in the filter are covered with a film of the liquid. The following equation (2) was used to calculate mean pore size:

$$d = C \times r/P \quad (2)$$

(wherein, d (units: μm) represents the pore size of the filter, r (units: N/m) represents the surface tension of the liquid, P (units: Pa) represents the pressure required to rupture the liquid film for a particular pore size, and C represents a constant).

When a flow volume (wet flow) is measured in the case of continuously varying the pressure P applied to the filter immersed in the liquid between low and high pressure, since the liquid film of the largest pores is not ruptured at the initial pressure, the flow volume is 0. As the pressure is increased, the liquid film of the largest pores is ruptured and a flow is generated (bubble point). As the pressure is further increased, the flow volume increases corresponding to each increase in pressure, the liquid film of the smallest pores is ruptured, and the resulting flow volume coincides with the flow volume in the dry state (dry flow).

In this measuring device, the value obtained by dividing the wet flow at a certain pressure by the dry flow at the same pressure is referred to as the cumulative filter flow (units: %). In addition, the pore size of the liquid film that is ruptured at a pressure at which the cumulative filter flow becomes 50% is referred to as the mean flow pore size, and this was used to indicate the mean pore size of the fabric used in the present invention.

In the present description, maximum pore size is defined to be the pore size at which the cumulative filter flow is within the range of −2σ of 50%, namely the pore size of a liquid film ruptured at a pressure at which the cumulative filter flow is 2.3%, by using the fabric for the filter.

[(9) Fabric Basis Weight]

Fabric basis weight was determined in accordance with the method defined in JIS L-1906:2000 by sampling a sample measuring 20 cm long×25 cm wide at three locations per 1 meter of sample width, measuring the weights of the samples and calculating the weight per unit surface area of the average value thereof.

[(10) Fabric Thickness]

Fabric thickness was measured in accordance with the method defined in JIS L-1906:2000 by measuring the thickness at 10 locations per 1 m of width and defining the average value thereof to be fabric thickness.

Measurements were carried out at a load of 9.8 kPa.

[(11) Fiber Diameter]

Mean fiber diameter (μm) was determined by arbitrarily selecting fibers from an electron micrograph and reading the diameters thereof from the micrograph. Values for mean fiber diameter indicate the arithmetic mean for n=50.

[(12) Metal Thickness]

Metal thickness was determined from SEM micrographs using an SEM electron microscope (SEM Model S-4800 manufactured by Hitachi, Ltd.). In addition, the major axes of metal clusters were also determined from SEM micrographs. The arithmetic mean for n=30 was used for each of the values.

[(13) Adhesion Model Test]

Double-sided adhesive tape was affixed to whole area of one side of a sample measuring 5 cm×5 cm. Next, the remaining surface of the double-sided adhesive tape was affixed to one half of a ping pong ball, and the degree of adhesion as well as the ease of affixing to the ping pong ball at that time were evaluated in the manner indicated below.

Excellent: Easily affixed and no problems with adhesion

Good: Easily affixed but some protrusion or wrinkling of the sample or rupturing of the sheet Fair: Able to be affixed but protrusion and wrinkling over the entire sample and rupturing of the sheet Poor: Extremely difficult to be affixed, and protrusion and wrinkling over the entire sample and rupturing of the sheet Examples 1 to 38

Noise absorbing fabrics of Examples 1 to 38 were produced according to the method described below followed by evaluation of noise absorbing ability. In Examples 1 to 3, 11 to 13 and 15, a spun-bond non-woven fabric composed of polyester resin (E05050) manufactured by Asahi Kasei Fibers Corp. was used for the fabric. Deposition was carried out using a vacuum deposition device and a standard board manufactured by Nilaco Corp. (Model SF-106 Tungsten) for the heat source. Basic conditions consisted of a degree of vacuum of $5 \times 10^{-5}$ torr, applied voltage of 5 V and deposition time of 180 seconds.

Using the aforementioned conditions for the basic conditions of metal processing, the degree of vacuum, the amount of heat applied to the deposition source (amount of electricity applied to the heat source depending on the case) and the deposition time were controlled in order to change the amount of metal subjected to metal processing so as to adjust the surface to have a common logarithmic value of surface resistivity that is within the range of the present invention. In general, in cases in which the metal subjected to metal processing was already decided, for example, the amount of metal subjected to metal processing was able to be easily adjusted by changing the deposition time. For example, the deposition time can be decreased in the case of decreasing the amount of metal subjected to metal processing, while the deposition time can be increased in the case of increasing the amount of metal subjected to metal processing.

The conditions used in each example are indicated in Table 1 and were supplemented as described below. Furthermore, with respect to magnetic permeability of the noise absorbing fabrics of Examples 1 to 12 and Examples 17 to 23, the mean value of μ' was about 1.0 within the range of 0.5 GHz to 6 GHz, and the mean value of μ" was about 0.0 within the range of 0.5 GHz to 6 GHz.

In Examples 2 and 3, the deposition times were changed from that of Example 1 to change the thickness of the metal.

In Examples 4 to 10 and Examples 17 to 23, conditions were the same as those of Example 1 with the exception of modifying the fabric as described below.

Example 4: PU5040 (material: polypropylene, Asahi Kasei Fibers Corp.)

Example 5: N05050 (material: Nylon 6, Asahi Kasei Fibers Corp.)

Examples 6, 14 and 16: Precise AS030 (material: PET, Asahi Kasei Fibers Corp.)

Example 7: Precise AS080 (material: PET, Asahi Kasei Fibers Corp.)

Laminated non-woven fabric obtained using Precise AS030 and Precise AS080 by laminating ordinary fibers in the form of a spun-bond non-woven fabric and microfibers in the form of a melt blown non-woven fabric layer and a spun-bond non-woven fabric layer in that order as shown in Table 1.

Examples 8, 9 and 10: Conditions were in accordance with Example 1 with the exception of using fabrics having different fiber diameter, basis weight and thickness, respectively.

EO5020, EO5030, EO5120 (material: PET, Asahi Kasei Fibers Corp.)

Example 17: Short fiber non-woven fabric (wet non-woven fabric: Purely 040BC, material: PET, Awa Paper Mfg. Co., Ltd.)

Example 18: Short fiber non-woven fabric (spun lace non-woven fabric: Sontara 8005, material: PET, DuPont Corp.) calendered prior to use Example 19: Tyvek (material: polyethylene, DAFS Co., Ltd.)

Example 20: Short fiber non-woven fabric: Unisel Melfit BT030EW (Teijin Ltd.)

Example 21: Melt blow non-woven fabric: E3008 (material: PET, Asahi Kasei Fibers Corp.), calendered prior to use Examples 22 and 23: Taffeta composed of ester yarn Examples 11 and 12: Noise absorbing fabrics were formed in accordance with Example 1 with the exception of using a deposition applied voltage of 7.5 V in Example 11 and using a deposition applied voltage of 10 V in Example 12.

Examples 13 and 14: Noise absorbing fabrics were formed in accordance with Example 1 with the exception of changing the metal to Ag in Example 13 and using Precise AS030 for the fabric and changing the metal to Ag in Example 14.

Examples 15 and 16: Noise absorbing fabric were formed in accordance with Example 1 with the exception of changing the metal to Ni in Example 15 and using Precise AS030 for the fabric and changing the metal to Ni in Example 16.

Example 24: An unattached long fiber web composed of filaments having a mean fiber diameter of 11 μm and varying in uniformity by 15% or less (to also be referred to as "web layer A"), obtained by extruding a long fiber group of filaments towards a moving scavenging surface at a spinning temperature of 300° C. by spun bonding general-purpose polyethylene terephthalate, spinning at a spinning speed of 3500 m/min and adequately opening by electrifying by corona charging at about 3 μC/g, was formed on a scavenging net surface at a basis weight of about 7.5 g/m².

Next, polyethylene terephthalate (melt viscosity ηsp/c: 0.50) was spun by melt blowing under conditions of a spinning temperature of 300° C., heated air temperature of 320° C. and blowing air rate of 1000 Nm³/hr/m, and microfibers fibers having a mean fiber diameter of 1.7 μm in the form of a random web having a basis weight of about 5 g/m² (to also be referred to as "web layer B") were blown out directly towards the web layer A. The distance from the melt blowing nozzle to the upper surface of the web layer A was made to be 100 mm, suction at the scavenging surface directly beneath the melt blowing nozzle was 0.2 kPa, and the blowing speed was about 7 m/sec.

A long fiber web composed of polyethylene terephthalate was opened in the same manner as the initially prepared web layer A on the side of the web layer B opposite from the web layer A to prepare a three-layer laminated web consisting of web layer A, web layer B and web layer A in that order.

Next, the three-layer laminated web was thermocompression bonded by passing between two flattening rollers to obtain a three-layer laminated non-woven fabric consisting of a non-woven fabric layer A, non-woven fabric layer B and non-woven fabric layer A in that order, after which metal was subjected to metal processing on the non-woven fabric layer A derived from the initially prepared web layer A to form a noise absorbing fabric.

Noise absorbing fabrics containing laminated non-woven fabrics having different fiber diameters were formed by going through the same process with the exception of changing the extrusion capacity of the resin. The compositions and fiber diameters of the resulting noise absorbing fabrics are shown in Table 1.

Examples 25 to 27: Noise absorbing fabrics were fabricated in the same manner as Example 24 with the exception of changing the thickness, basis weight and fiber diameter as shown in Table 1.

Examples 28 and 29: After forming a two-layer laminated web consisting of web layer A and web layer B in the same manner as Example 24, the two-layer laminated web was thermocompression bonded by passing between two flattening rollers to obtain two-layer laminated non-woven fabrics having non-woven fabric layer A derived from web layer A and non-woven fabric layer B derived from web layer B, followed by carrying out metal processing on the non-woven fabric layer B to form a noise absorbing fabrics. The properties of the resulting noise absorbing fabrics are shown in Table 1.

Examples 30 to 32: Noise absorbing fabrics containing non-woven fabric layer B were formed by melt blowing in the same manner as Example 24 with the exception of not forming the web layer A, changing the extrusion capacity of the resin when forming the web layer B, and changing the fiber diameter. The properties of the resulting noise absorbing fabrics are shown in Table 1.

Examples 33 and 34: Noise absorbing fabrics containing the non-woven fabric layer A were formed by spun bonding in the same manner as Example 24 with the exception of not forming the web layer B, changing the extrusion capacity of the resin when forming the web layer A, and changing the fiber diameter. The properties of the resulting noise absorbing fabrics are shown in Table 1.

Examples 35 to 38: A non-woven fabric composed of microfibers manufactured by Finetex Technology Global Ltd. and formed by electrospinning (ELSP) was further superimposed on Precise AS030 to form a laminated non-woven fabric, and laminated noise absorbing fabrics were formed by subjecting metal to metal processing on the non-woven fabric side composed of microfibers. The basis weight of ELSP was 2 g/m² or 1 g/m². The material of the microfibers was Nylon 6 in Examples 35 and 36 and PVDF in Examples 37 and 38.

Furthermore, Examples 24 to 37 were carried out in the same manner as Example 1.

Comparative Examples 1 to 4

Noise absorbing fabrics were produced in accordance with Example 1 with the exception of changing the metal species subjected to metal processing and the thickness of the metal.

Comparative Examples 5 to 8

Noise absorbing fabrics were produced in accordance with Example 1 with the exception of changing the fabric to a film, and further changing the metal species subjected to metal processing and the thickness of the metal.

Furthermore, Teijin Tetron Film (Type G2: 16 μm, Type S: 188 μm) were used for the film in Comparative Examples 5 to 7, while an H type film (25 μm) manufactured by Dupont-Toray Co., Ltd. was used for the film in Comparative Example 8.

Comparative Example 9

A commercially available product (Busteraid® Type R4N) was evaluated as a noise absorbing base material.

The results for Examples 1 to 38 are summarized in Table 1, while the results for Comparative Examples 1 to 9 are summarized in Table 2. Moreover, measurement results obtained according to the microstrip line method for Example 1, Example 4, Example 6 and Comparative Example 6 are shown in FIGS. 7 to 10.

Figure 13:
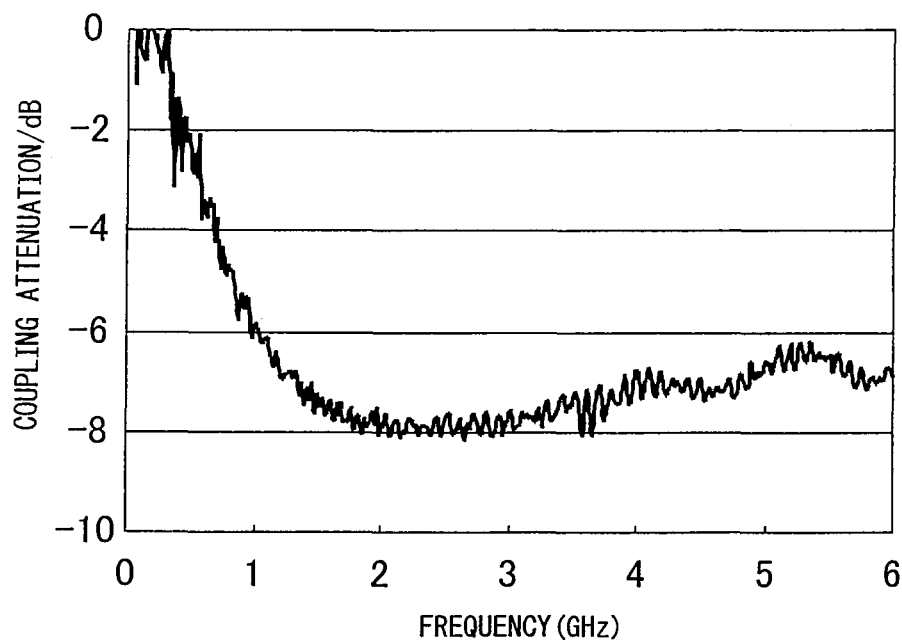
FIG. 13 is a drawing showing coupling attenuation as determined by a loop antenna method A of a noise absorbing fabric formed in Example 6.
Figure 14:
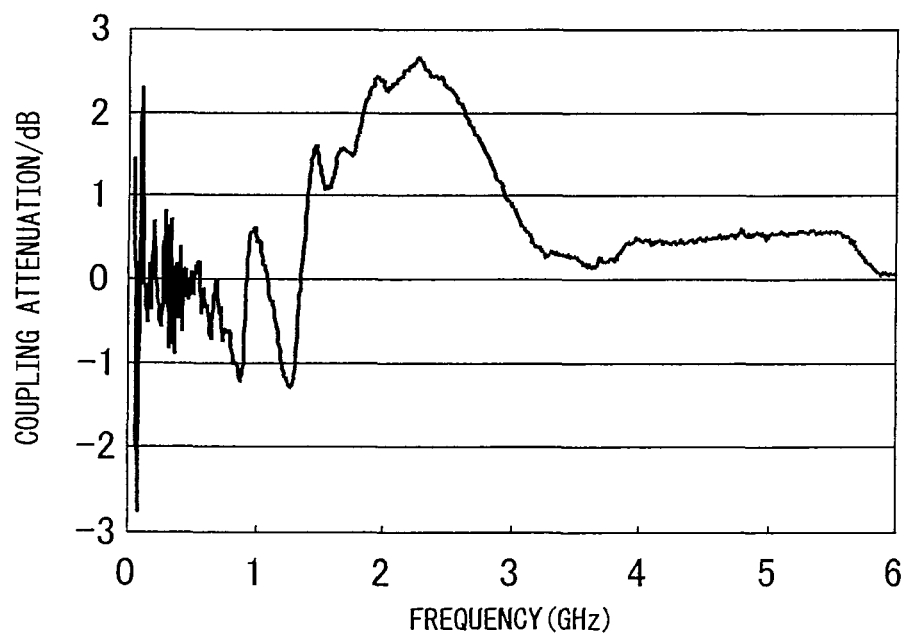
FIG. 14 is a drawing showing coupling attenuation as determined by a loop antenna method A of a noise absorbing base material formed in Comparative Example 6.
Figure 15:
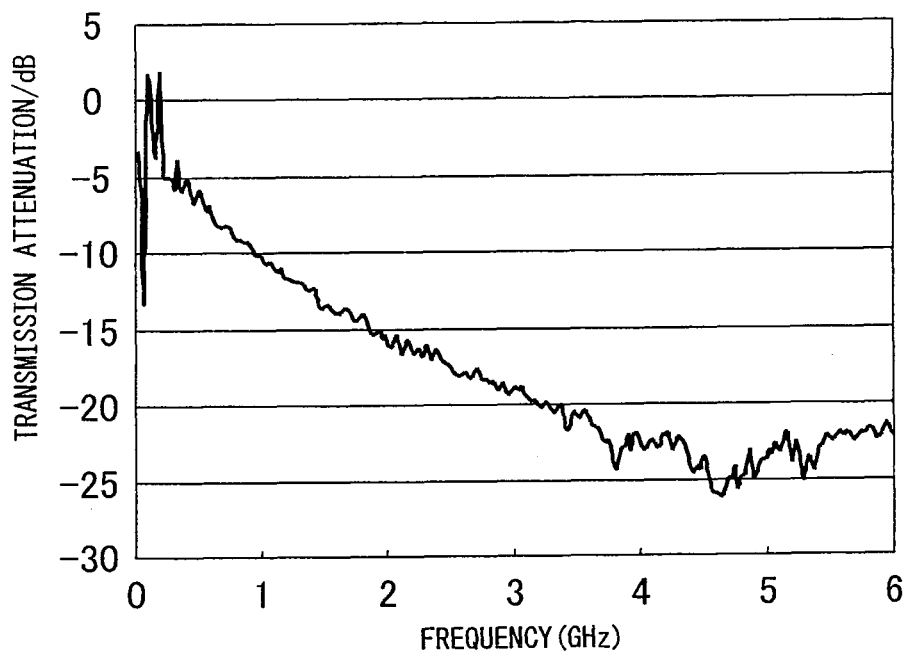
FIG. 15 is a drawing showing transmission attenuation as determined by a loop antenna method B of a noise absorbing fabric formed in Example 6.
Figure 16:
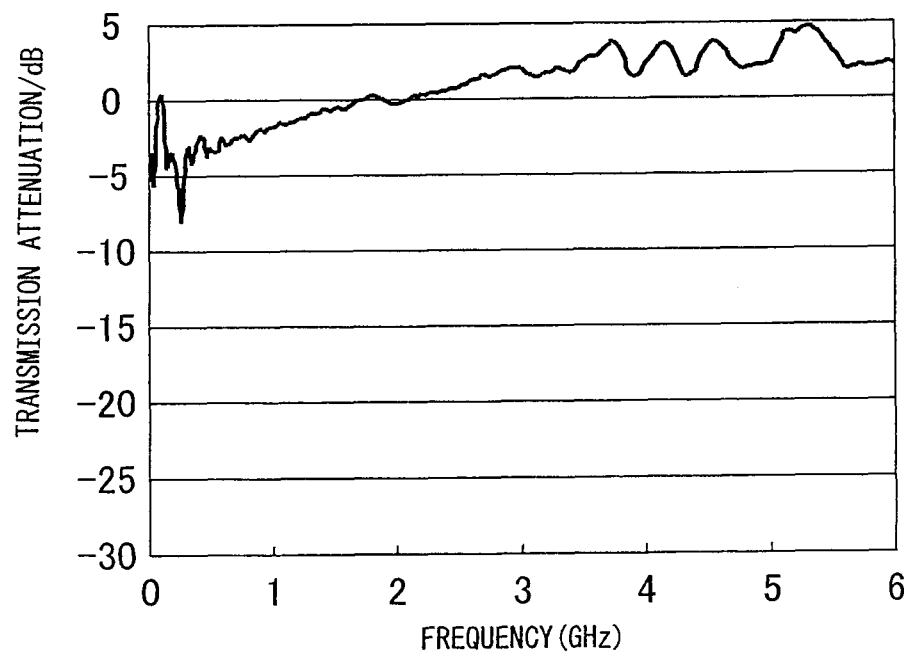
FIG. 16 is a drawing showing transmission attenuation as determined by a loop antenna method B of a noise absorbing base material formed in Comparative Example 6.
Figure 17:
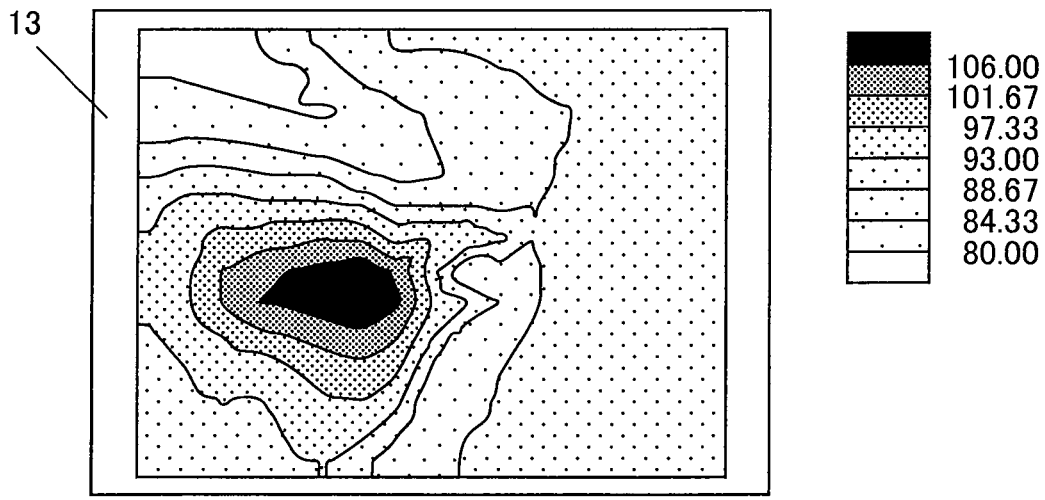
FIG. 17 is a drawing showing the results of magnetic field strength mapping with a noise absorption visualization device for a demo substrate prior to affixing a noise absorbing fabric.
Figure 18:
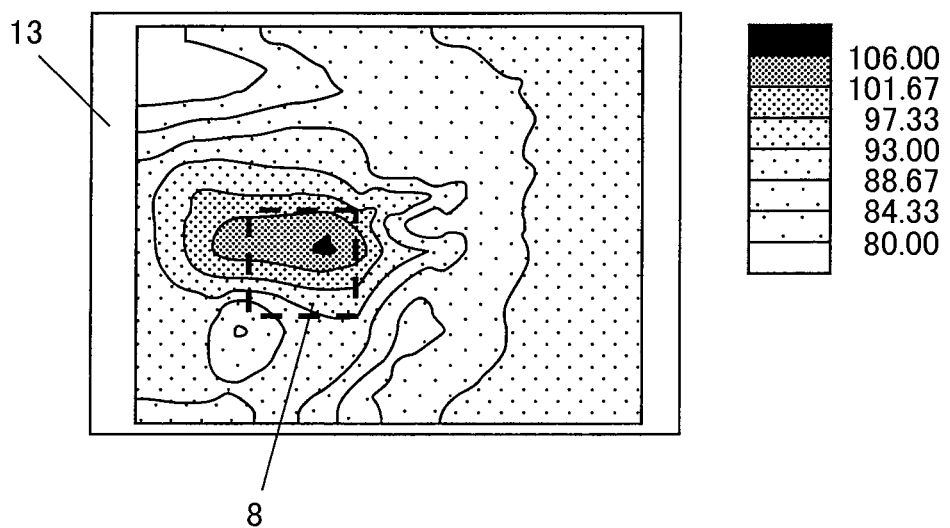
FIG. 18 is a drawing showing the results of magnetic field strength mapping with a noise absorption visualization device for a demo substrate after affixing the noise absorbing fabric formed in Example 6.
Figure 19:
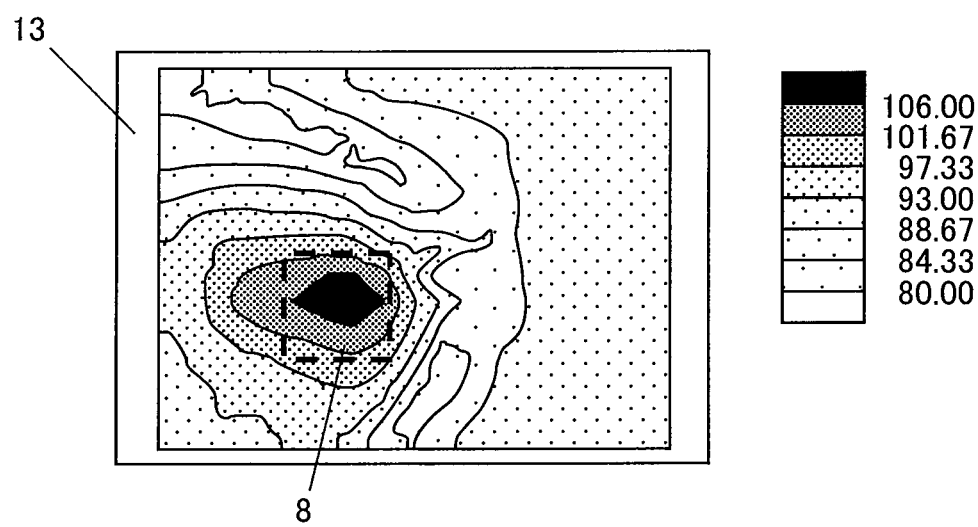
FIG. 19 is a drawing showing the results of magnetic field strength mapping with a noise absorption visualization device for a demo substrate after affixing the noise absorbing base material formed in Comparative Example 6.
Figure 20:
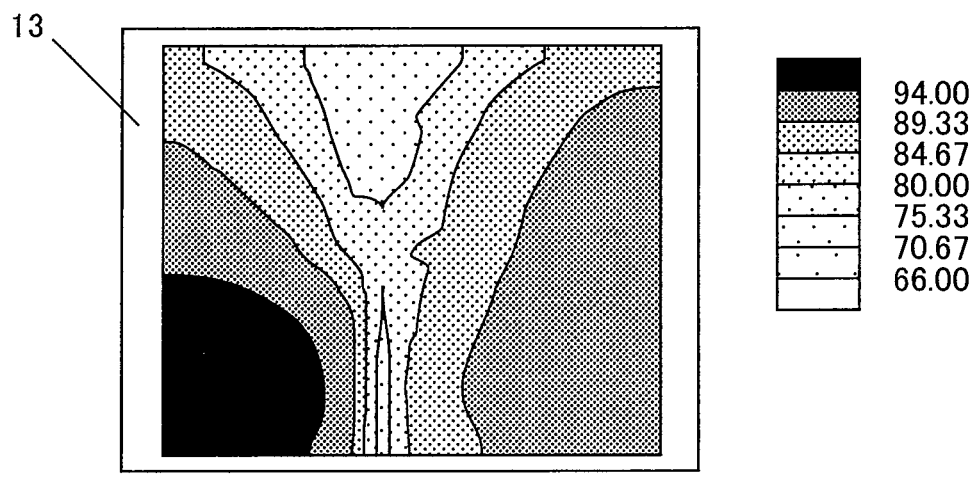
FIG. 20 is a drawing showing the results of electric field strength mapping with a noise absorption visualization device for a demo substrate prior to affixing a noise absorbing fabric.
Figure 21:
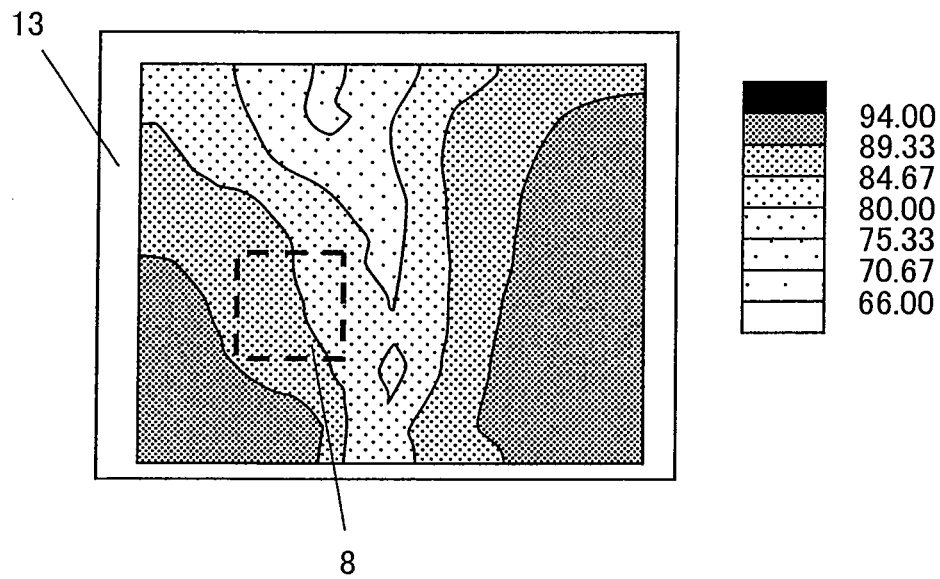
FIG. 21 is a drawing showing the results of electric field strength mapping with a noise absorption visualization device for a demo substrate after affixing the noise absorbing fabric formed in Example 6.
Figure 22:
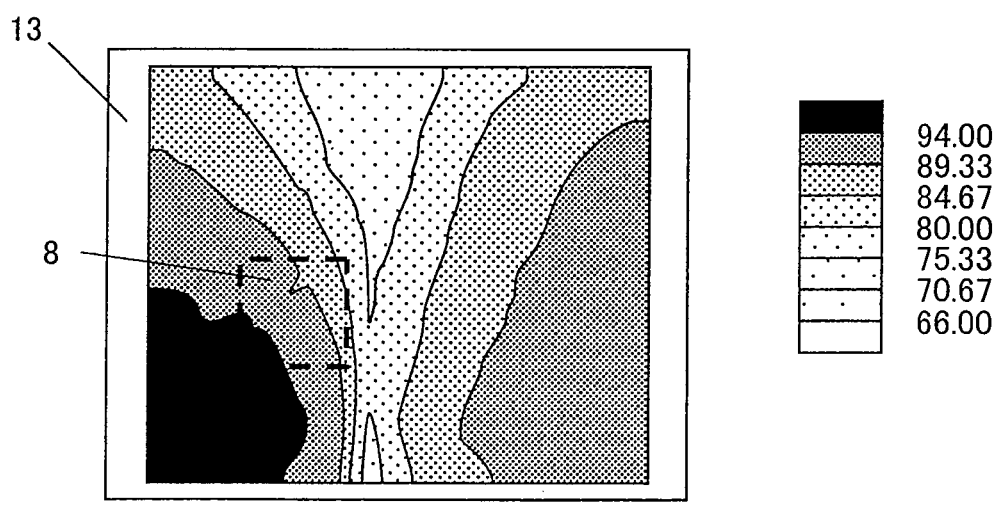
FIG. 22 is a drawing showing the results of electric field strength mapping with a noise absorption visualization device for a demo substrate after affixing the noise absorbing base material formed in Comparative Example 6.

Coupling attenuation as determined by loop antenna method A for the noise absorbing fabric of Example 6 and the noise absorbing base material of Comparative Example 6 is shown in FIGS. 13 and 14, respectively. In addition, transmission attenuation as determined by loop antenna method B for the noise absorbing fabric of Example 6 and the noise absorbing base material of Comparative Example 6 is shown in FIGS. 15 and 16, respectively. Results of mapping magnetic field strength of a demo board prior to affixing a noise absorbing fabric with a noise absorption visualization device are shown in FIG. 17, while results of mapping magnetic field strength of demo boards after affixing the noise absorbing fabric of Example 6 and the noise absorbing base material of Comparative Example 6 are shown in FIGS. 18 and 19, respectively. In addition, results of mapping electric field strength of a demo board prior to affixing a noise absorbing fabric with a noise absorption visualization device are shown in FIG. 20, while results of mapping electric field strength of demo boards after affixing the noise absorbing fabric of Example 6 and the noise absorbing base material of Comparative Example 6 are shown in FIGS. 21 and 22, respectively.

On the basis of these results, the noise absorbing ability of the noise absorbing fabric of the present invention was suggested to be more greatly attributable to electric field inhibitory effects than magnetic field inhibitory effects.

Furthermore, reference symbol 13 indicates a demo board in FIGS. 17 to 22.

TABLE 1

| | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Fabric type | EO5050 | EO5050 | EO5050 | PU5040 | NO5050 | AS030 | AS080 | EO5020 | EO5030 | EO5120 |
| Thickness of noise absorbing fabric (μm) | 170 | 170 | 170 | 150 | 170 | 30 | 80 | 100 | 130 | 270 |
| Basis weight of noise absorbing fabric (g/m$^2$) | 50 | 50 | 50 | 40 | 50 | 20 | 60 | 20 | 30 | 120 |
| Ordinary fiber diameter (μm) | 16 | 16 | 16 | 19 | 16 | 12 | 12 | 16 | 16 | 16 |
| Microfiber diameter (μm) | — | — | — | — | — | 1.7 | 1.7 | — | — | — |
| ELSP fiber diameter (μm) | — | — | — | — | — | — | — | — | — | — |
| Mean pore size (μm) | 20 | 20 | 20 | 26 | 18 | 9 | 3 | 37 | 30 | 8 |
| Metal species | Al | Al | Al | Al | Al | Al | Al | Al | Al | Al |
| Metal thickness (nm) | 50 | 5 | 270 | 48 | 45 | 52 | 55 | 35 | 41 | 55 |
| Surface resistivity (Ω/□) | 72.5 | 7250 | 5 | 73.2 | 70.4 | 3 | 2 | 150 | 113 | 51 |
| Common logarithmic value of surface resistivity | 1.9 | 3.9 | 0.7 | 1.9 | 1.8 | 0.5 | 0.3 | 2.2 | 2.1 | 1.7 |
| Loss ratio (1 GHz) | 0.18 | 0.11 | 0.21 | 0.19 | 0.18 | 0.72 | 0.65 | 0.11 | 0.12 | 0.15 |
| S11 value (1 GHz) | 0.01 | 0.01 | 0.02 | 0.01 | 0.01 | 0.05 | 0.04 | 0.01 | 0.01 | 0.01 |
| Loss ratio (3 GHz) | 0.55 | 0.38 | 0.61 | 0.52 | 0.54 | 0.91 | 0.93 | 0.42 | 0.5 | 0.54 |
| S11 value (3 GHz) | 0.04 | 0.01 | 0.1 | 0.05 | 0.04 | 0.08 | 0.04 | 0.01 | 0.03 | 0.06 |
| Loss ratio (10 GHz) | 0.91 | 0.82 | 0.93 | 0.87 | 0.9 | 0.95 | 0.94 | 0.81 | 0.85 | 0.89 |
| S11 value (10 GHz) | 0.03 | 0.04 | 0.12 | 0.05 | 0.03 | 0.09 | 0.07 | 0.04 | 0.05 | 0.05 |
| Adhesion Model Test | Excellent | Excellent | Excellent | Excellent | Excellent | Excellent | Good | Excellent | Excellent | Good |

| | Ex. 11 | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|---|
| Fabric type | EO5050 | EO5050 | EO5050 | AS030 | EO5050 | AS030 | 040BC | Sontara | Tyvek | BT030EW |
| Thickness of noise absorbing fabric (μm) | 170 | 170 | 170 | 30 | 170 | 30 | 50 | 200 | 150 | 96 |
| Basis weight of noise absorbing fabric (g/m$^2$) | 50 | 50 | 50 | 20 | 50 | 20 | 40 | 50 | 42 | 30 |
| Ordinary fiber diameter (μm) | 16 | 16 | 16 | 12 | 16 | 17 | 11 | — | — | — |
| Microfiber diameter (μm) | — | — | — | 1.7 | — | 2 | — | — | — | — |

TABLE 1-continued

|  |  |  |  |  |  |  |  |  |  |  |
|---|---|---|---|---|---|---|---|---|---|---|
| ELSP fiber diameter (μm) | — | — | — | — | — | — | — | — | — | — |
| Mean pore size (μm) | 20 | 20 | 20 | 9 | 20 | 9 | 8 | 55 | 3 | 30 |
| Metal species | Al | Al | Ag | Ag | Ni | Ni | Al | Al | Al | Al |
| Metal thickness (nm) | 53 | 56 | 51 | 54 | 46 | 51 | 33 | 65 | 55 | 50 |
| Surface resistivity (Ω/□) | 92 | 145 | 23 | 11 | 107 | 11 | 81 | 75 | 237 | 221 |
| Common logarithmic value of surface resistivity | 2.0 | 2.2 | 1.4 | 1.0 | 2.0 | 1.0 | 1.9 | 1.9 | 2.4 | 2.3 |
| Loss ratio (1 GHz) | 0.19 | 0.2 | 0.13 | 0.48 | 0.15 | 0.18 | 0.15 | 0.18 | 0.3 | 0.22 |
| S11 value (1 GHz) | 0.01 | 0.01 | 0.08 | 0.19 | 0.22 | 0.02 | 0.02 | 0.02 | 0.04 | 0.03 |
| Loss ratio (3 GHz) | 0.58 | 0.59 | 0.48 | 0.68 | 0.5 | 0.56 | 0.5 | 0.56 | 0.66 | 0.49 |
| S11 value (3 GHz) | 0.04 | 0.04 | 0.15 | 0.19 | 0.03 | 0.01 | 0.03 | 0.01 | 0.08 | 0.08 |
| Loss ratio (10 GHz) | 0.92 | 0.92 | 0.72 | 0.79 | 0.81 | 0.82 | 0.87 | 0.88 | 0.72 | 0.77 |
| S11 value (10 GHz) | 0.04 | 0.04 | 0.15 | 0.2 | 0.12 | 0.15 | 0.09 | 0.05 | 0.15 | 0.12 |
| Adhesion Model Test | Excellent | Excellent | Excellent | Excellent | Excellent | Excellent | Excellent | Excellent | Good | Good |

|  | Ex. 21 | Ex. 22 | Ex. 23 | Ex. 24 | Ex. 25 | Ex. 26 | Ex. 27 | Ex. 28 | Ex. 29 |
|---|---|---|---|---|---|---|---|---|---|
| Fabric type | E3008 | Taffeta | Taffeta | Laminate 3 layers | Laminate 3 layers | Laminate 3 layers | Laminate 3 layers | Laminate 2 layers | Laminate 2 layers |
| Thickness of noise absorbing fabric (μm) | 110 | 100 | 200 | 30 | 31 | 30 | 30 | 30 | 32 |
| Basis weight of noise absorbing fabric (g/m²) | 42 | 50 | 75 | 20 | 20 | 20 | 20 | 12.6 | 12.5 |
| Ordinary fiber diameter (μm) | — | 46 | 34 | 11 | 12 | 11 | 13 | 11 | 17 |
| Microfiber diameter (μm) | 0.8 | — | — | 1.7 | 1.3 | 1.1 | 0.7 | 1.4 | 0.9 |
| ELSP fiber diameter (μm) | — | — | — | — | — | — | — | — | — |
| Mean pore size (μm) | 1.5 | 110 | 65 | 7.8 | 6.5 | 5.8 | 4.9 | 8.8 | 6.4 |
| Metal species | Al | Al | Al | Al | Al | Al | Al | Al | Al |
| Metal thickness (nm) | 75 | 32 | 45 | 47 | 47 | 47 | 48 | 49 | 46 |
| Surface resistivity (Ω/□) | 15 | 22 | 70 | 37 | 20 | 13 | 8 | 32 | 16 |
| Common logarithmic value of surface resistivity | 1.2 | 1.3 | 1.8 | 1.6 | 1.3 | 1.1 | 0.9 | 1.5 | 1.2 |
| Loss ratio (1 GHz) | 0.9 | 0.05 | 0.18 | 0.75 | 0.81 | 0.85 | 0.91 | 0.88 | 0.91 |
| S11 value (1 GHz) | 0.05 | 0.01 | 0.01 | 0.04 | 0.05 | 0.06 | 0.07 | 0.03 | 0.06 |
| Loss ratio (3 GHz) | 0.95 | 0.25 | 0.3 | 0.92 | 0.93 | 0.95 | 0.94 | 0.94 | 0.95 |
| S11 value (3 GHz) | 0.02 | 0.01 | 0.01 | 0.04 | 0.05 | 0.06 | 0.06 | 0.04 | 0.04 |
| Loss ratio (10 GHz) | 0.97 | 0.55 | 0.62 | 0.97 | 0.98 | 0.94 | 0.92 | 0.96 | 0.96 |
| S11 value (10 GHz) | 0.01 | 0.01 | 0.03 | 0.05 | 0.05 | 0.05 | 0.08 | 0.03 | 0.04 |
| Adhesion Model Test | Good | Excellent | Excellent | Excellent | Excellent | Excellent | Excellent | Excellent | Excellent |

|  | Ex. 30 | Ex. 31 | Ex. 32 | Ex. 33 | Ex. 34 | Ex. 35 | Ex. 36 | Ex. 37 | Ex. 38 |
|---|---|---|---|---|---|---|---|---|---|
| Fabric type | Non-woven fabric layer B | Non-woven fabric layer B | Non-woven fabric layer B | Non-woven fabric layer A | Non-woven fabric layer A | Laminate | Laminate | Laminate | Laminate |
| Thickness of noise absorbing fabric (μm) | 40 | 45 | 50 | 35 | 40 | 35 | 42 | 37 | 40 |
| Basis weight of noise absorbing fabric (g/m²) | 15 | 20 | 20 | 25 | 25 | 31 | 32 | 31 | 32 |
| Ordinary fiber diameter (μm) | 12 | — | — | — | — | 1.2 | 1.2 | 1.2 | 1.2 |
| Microfiber diameter (μm) | 0.7 | 0.5 | 0.3 | 6.9 | 5.7 | 1.7 | 1.7 | 1.7 | 1.7 |
| ELSP fiber diameter (μm) | — | — | — | — | — | 0.1 | 0.1 | 0.1 | 0.1 |
| Mean pore size (μm) | 1.2 | 0.7 | 0.4 | 25 | 23 | — | — | — | — |
| Metal species | Al | Al | Al | Al | Al | Al | Al | Al | Al |
| Metal thickness (nm) | 51 | 51 | 52 | 51 | 50 | 51 | 50 | 51 | 50 |
| Surface resistivity (Ω/□) | 32 | 26 | 18 | 72 | 59 | 17 | 16 | 19 | 23 |

TABLE 1-continued

|  |  |  |  |  |  |  |  |  |  |
|---|---|---|---|---|---|---|---|---|---|
| Common logarithmic value of surface resistivity | 1.5 | 1.4 | 1.3 | 1.9 | 1.8 | 1.2 | 1.2 | 1.3 | 1.4 |
| Loss ratio (1 GHz) | 0.91 | 0.94 | 0.95 | 0.35 | 0.42 | 0.95 | 0.96 | 0.94 | 0.95 |
| S11 value (1 GHz) | 0.05 | 0.03 | 0.03 | 0.01 | 0.02 | 0.03 | 0.04 | 0.03 | 0.02 |
| Loss ratio (3 GHz) | 0.94 | 0.95 | 0.06 | 0.78 | 0.8 | 0.96 | 0.96 | 0.94 | 0.95 |
| S11 value (3 GHz) | 0.02 | 0.03 | 0.03 | 0.01 | 0.02 | 0.03 | 0.04 | 0.04 | 0.04 |
| Loss ratio (10 GHz) | 0.96 | 0.97 | 0.96 | 0.9 | 0.9 | 0.96 | 0.95 | 0.95 | 0.94 |
| S11 value (10 GHz) | 0.02 | 0.02 | 0.02 | 0.01 | 0.01 | 0.03 | 0.04 | 0.04 | 0.05 |
| Adhesion Model Test | Good | Good | Good | Excellent | Excellent | Excellent | Excellent | Excellent | Excellent |

TABLE 2

|  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|
| Base material type | EO5050 | EO5050 | EO5050 | EO5050 | PET film | PET film | PET film | Polyimide film | Busteraid |
| Thickness of noise absorbing fabric (μm) | 170 | 170 | 170 | 170 | 16 | 16 | 188 | 25 | 100 |
| Basis weight of noise absorbing fabric (g/m$^2$) | 50 | 50 | 50 | 50 | — | — | — | — | — |
| Mean fiber diameter (μm) | 20 | 20 | 20 | 20 | — | — | — | — | — |
| Metal species | Ag | Ag | Al | Al | Ag | Al | Al | Al | — |
| Metal thickness (nm) | 800 | 550 | 5 | — | 10 | 58 | 59 | 55 | — |
| Surface resistivity (Ω/□) | 0.04 | 0.5 | — | — | 0.9 | 2.5 | 1.8 | 3.2 | — |
| Common logarithmic value of surface resistivity | −1.40 | −0.30 | 5.2 | 7.20 | −0.05 | 0.40 | 0.26 | 0.51 | — |
| Loss ratio (1 GHz) | 0.06 | 0.05 | 0.06 | 0 | 0.05 | 0.69 | 0.66 | 0.65 | 0.31 |
| S11 value (1 GHz) | 0.89 | 0.7 | 0 | 0 | 0.61 | 0.11 | 0.15 | 0.15 | 0.01 |
| Loss ratio (3 GHz) | 0.02 | 0.21 | 0.1 | 0 | 0.08 | 0.57 | 0.49 | 0.51 | 0.56 |
| S11 value (3 GHz) | 0.91 | 0.65 | 0 | 0 | 0.72 | 0.44 | 0.46 | 0.42 | 0.01 |
| Loss ratio (10 GHz) | 0.02 | 0.09 | 0.06 | 0 | 0.06 | 0.02 | 0.02 | 0.05 | 0.9 |
| S11 value (10 GHz) | 0.96 | 0.85 | 0 | 0 | 0.94 | 0.98 | 0.95 | 0.95 | 0.01 |
| Adhesion Model Test | Excellent | Excellent | Excellent | Excellent | Fair | Fair | Poor | Fair | Poor |

INDUSTRIAL APPLICABILITY

The noise absorbing fabric of the present invention is preferably used in a noise absorbing article installed in electronic equipment. For example, the noise absorbing fabric of the present invention can be used by mounting in the housing of an electronic device or mounting in an electronic component or transmission line and the like.

DESCRIPTION OF THE REFERENCE SYMBOLS

1 Noise absorbing fabric
2 Fabric
3 Metal-processed metal
4 Fibers
5 Metal clusters
6 Metal particles
7 Microstrip line fixture
8 Sample
9 Network analyzer
10 Microstrip line
11 Microloop antenna
12 Microloop antenna fixture
13 Demo board

The invention claimed is:

1. A noise absorbing fabric comprising a fabric, wherein the fabric comprises at least one metal present in at least one side of the fabric; wherein the metal is directly adhered to fibers that compose the fabric, wherein the common logarithmic value of the surface resistivity of the side of the fabric in which the metal is present is within the range of 0 to 4,
wherein the fabric contains a layer of fibers having a fiber diameter of 2 μm or less, and the mean pore size of the fabric is 0.5 μm to 5.0 mm,
wherein a thickness of the at least one metal in the noise absorbing fabric is 2 nm to 400 nm,
wherein the metal contains a plurality of discontinuous metal clusters, wherein the metal clusters have an arithmetic mean value of the major axis thereof of 2 to 200 nm, and wherein a reflection attenuation S11 at 1 GHz is 0.07 or less.

2. The noise absorbing fabric according to claim 1, wherein the ratio of metal to the total amount of metal and fabric inside the fabric is lower than the ratio of metal to the total amount of metal and fabric on the surface thereby electrical conductivity inside the fabric is smaller than electrical conductivity of the side of the fabric in which the at least one metal is present.

3. The noise absorbing fabric according to claim 1, wherein the fabric is a non-woven fabric composed of synthetic long fibers.

4. The noise absorbing fabric according to claim 1, wherein the at least one metal has been deposited on fibers of the fabric by metal deposition.

5. The noise absorbing fabric according to claim 1, wherein the fabric has the thickness of 10 μm to 400 μm and the basis weight of 7 g/m$^2$ to 300 g/m$^2$.

6. The noise absorbing fabric according to claim 1, wherein the fabric has been subjected to calendering.

7. The noise absorbing fabric according to claim 1, wherein the at least one metal is one or a plurality of metals not having magnetic properties.

8. The noise absorbing fabric according to claim 1, wherein the at least one metal has been deposited on fibers of the fabric by depositing one or a plurality of metals having a valve action.

9. A noise absorbing article containing the noise absorbing fabric according to any of claims 1 to 3, 4, 5, 6, 7 and 8.

10. The noise absorbing fabric according to claim 1, wherein the fabric comprises a layer of fibers having a fiber diameter of 2 μm or less and a layer of fibers having a fiber diameter of greater than 7 μm.

11. The noise absorbing fabric according to claim 1, wherein the fabric comprises a spun-bond non-woven fabric layer and a melt blown non-woven fabric layer.

* * * * *